US008892237B2

(12) United States Patent
Vaid et al.

(10) Patent No.: US 8,892,237 B2
(45) Date of Patent: Nov. 18, 2014

(54) SYSTEMS AND METHODS FOR FABRICATING SEMICONDUCTOR DEVICE STRUCTURES USING DIFFERENT METROLOGY TOOLS

(71) Applicant: GLOBALFOUNDRIES, Inc., Grand Cayman (KY)

(72) Inventors: Alok Vaid, Ballston Lake, NY (US); Carsten Hartig, Meerane (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/841,919

(22) Filed: Mar. 15, 2013

(65) Prior Publication Data

US 2014/0273299 A1  Sep. 18, 2014

(51) Int. Cl.
| G06F 19/00 | (2011.01) |
| H01L 21/66 | (2006.01) |
| G01D 21/00 | (2006.01) |
| H01L 21/67 | (2006.01) |
| H01L 21/02 | (2006.01) |

(52) U.S. Cl.
CPC ............... *H01L 22/20* (2013.01); *G01D 21/00* (2013.01); *H01L 22/10* (2013.01); *H01L 22/12* (2013.01); *H01L 22/26* (2013.01); *H01L 21/67276* (2013.01); *H01L 21/02002* (2013.01); *H01L 21/67248* (2013.01)
USPC .......................................... 700/121; 438/14

(58) Field of Classification Search
CPC ......... H01L 22/10; H01L 22/12; H01L 22/20; H01L 22/26; H01L 21/67276; H01L 21/02002; H01L 21/67248

USPC ................ 438/14–18; 702/57–80; 700/121
See application file for complete search history.

(56) References Cited

U.S. PATENT DOCUMENTS

| 5,926,690 | A  | * | 7/1999  | Toprac et al. ................... 438/17 |
| 5,969,273 | A  | * | 10/1999 | Archie et al. ................. 73/865.8 |
| 6,277,661 | B1 | * | 8/2001  | Yang et al. ...................... 438/14 |
| 6,388,253 | B1 | * | 5/2002  | Su ................................... 250/310 |
| 6,441,398 | B2 | * | 8/2002  | Yang et al. ...................... 257/48 |
| 6,581,023 | B1 | * | 6/2003  | Kim ................................ 702/155 |
| 6,587,744 | B1 | * | 7/2003  | Stoddard et al. ............. 700/121 |
| 6,625,512 | B1 | * | 9/2003  | Goodwin ...................... 700/121 |
| 6,789,033 | B2 | * | 9/2004  | Solecky et al. ................ 702/85 |

(Continued)

OTHER PUBLICATIONS

Silver, R. et al., "Improving optical measurement accuracy using multi-technique nested uncertainties" in Metrology, Inspection, and Process Control for Microlithography XXIII, edited by John A. Allgair, Christopher J. Raymond, Proceedings of SPIE vol. 7272 (SPIE, Bellingham, WA 2009) 727202.

(Continued)

*Primary Examiner* — Karen Kusumakar
(74) *Attorney, Agent, or Firm* — Ingrassia Fisher & Lorenz, P.C.

(57) ABSTRACT

Methods and systems are provided for fabricating and measuring physical features of a semiconductor device structure. An exemplary method of fabricating a semiconductor device structure involves obtaining a first measurement of a first attribute of the semiconductor device structure from a first metrology tool, obtaining process information pertaining to fabrication of one or more features of the semiconductor device structure by a first processing tool, and determining an adjusted measurement for the first attribute based at least in part on the first measurement in a manner that is influenced by the process information.

20 Claims, 8 Drawing Sheets

(56) References Cited

U.S. PATENT DOCUMENTS

| | | | | |
|---|---|---|---|---|
| 6,862,545 | B1* | 3/2005 | Lee et al. | 702/97 |
| 7,158,851 | B2* | 1/2007 | Funk | 700/121 |
| 7,479,633 | B2* | 1/2009 | Archie | 250/310 |
| 2003/0015493 | A1* | 1/2003 | Grasshoff et al. | 216/59 |
| 2006/0007453 | A1* | 1/2006 | Horak et al. | 356/625 |

OTHER PUBLICATIONS

Rana, N. et al., "Hybrid reference metrology exploiting patterning simulation" in Metrology, Inspection, and Process Control for Microlithography XXIV, edited by Christopher J. Raymond, Proceedings of SPIE vol. 7638 (SPIE, Bellingham, WA 2010) 76380W.

Foucher, J. et al., "3D-AFM enhancement for CD metrology dedicated to lithography sub-28-nm node requirements" in Metrology, Inspection, and Process Control for Microlithography XXIV, edited by Christopher J. Raymond, Proceedings of SPIE vol. 7638 (SPIE, Bellingham, WA 2010) 763802.

Vaid A. et al., "Simultaneous measurement of optical properties and geometry of resist using multiple scatterometry targets" in Journal of Micro/Nanolithography, MEMS, and MOEMS 9(04) 041306 (Dec. 9, 2010).

Vaid et al., "A Holistic Metrology Approach: Hybrid Metrology Utilizing Scatterometry," Proceedings of SPIE vol. 7971 (Mar. 28, 2011) 797103.

Vaid et al., "Hybrid Metrology for Advanced Semiconductor Fabrication," SPIE Newsroom, (Aug. 17, 2011).

U.S. Appl. No. 13/419,286, filed Mar. 13, 2012.

U.S. Appl. No. 13/365,920, filed Feb. 3, 2012.

* cited by examiner

SYSTEMS AND METHODS FOR FABRICATING SEMICONDUCTOR DEVICE STRUCTURES USING DIFFERENT METROLOGY TOOLS

TECHNICAL FIELD

Embodiments of the subject matter described herein generally relate to systems and methods for fabricating semiconductor device structures and more particularly, embodiments of the subject matter relate to systems and methods for fabricating semiconductor devices wherein the systems and methods determine measurements of physical features, dimensions, or other attributes of semiconductor device structures using measurements obtained from different metrology tools in combination with available data and/or information pertaining to the fabrication of those features, dimensions, or other attributes of the semiconductor device structure.

BACKGROUND

Semiconductor devices, such as transistors, are the core building block of the vast majority of electronic devices. In practice, it is desirable to accurately and precisely fabricate transistors and other semiconductor devices with physical features having specific physical dimensions to thereby achieve semiconductor devices having their intended performance characteristics and to improve yield. However, the hardware tools used to fabricate the devices may exhibit performance variations. As a result, devices may be fabricated with features that deviate from their specified physical dimensions, which, in turn, could lead to failures at wafer test and, accordingly, reduce yield. Thus, it is desirable to measure physical features, critical dimensions and/or other properties of devices during fabrication to correct any deviations from the intended physical dimensions and thereby reduce the likelihood of failures at wafer test and improve yield. However, obtaining highly accurate measurements typically takes an undesirably long amount of time or involves destructive metrologies that reduce yield. At the same time, non-destructive measurement tools may be limited in their ability to accurately measure all of the physical features, critical dimensions, and profile information of a device, which, in turn, limits the ability of a foundry (or fab) to maximize yield.

BRIEF SUMMARY

In one embodiment, a system for fabricating a semiconductor device structure is provided. The system includes a processing tool, a metrology tool, and a computing device coupled to the metrology tool. The processing tool is configured to fabricate a feature of the semiconductor device structure, the metrology tool is configured to obtain a first measurement of an attribute of the semiconductor device structure, and the computing device is configured to obtain process information pertaining to the fabrication of the feature of the semiconductor device structure by the processing tool and determine a second measurement of the attribute based at least in part on the first measurement in a manner that is influenced by the process information.

In another embodiment, a method of fabricating a semiconductor device structure is provided. The method involves obtaining a first measurement of an attribute of the semiconductor device structure from a metrology tool, obtaining process information pertaining to fabrication of a feature of the semiconductor device structure by a processing tool, and determining a second measurement for the attribute based at least in part on the first measurement in a manner that is influenced by the process information.

In yet another embodiment, a method of fabricating a semiconductor device structure involves obtaining a first measurement of a feature of the semiconductor device structure from a first metrology tool, obtaining a second measurement of an attribute of the semiconductor device structure from a second metrology tool, obtaining process information pertaining to fabrication of the feature by a first processing tool, and determining a process-enhanced hybrid measurement for the feature based at least in part on the first measurement in a manner that is influenced by the process information and the second measurement.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
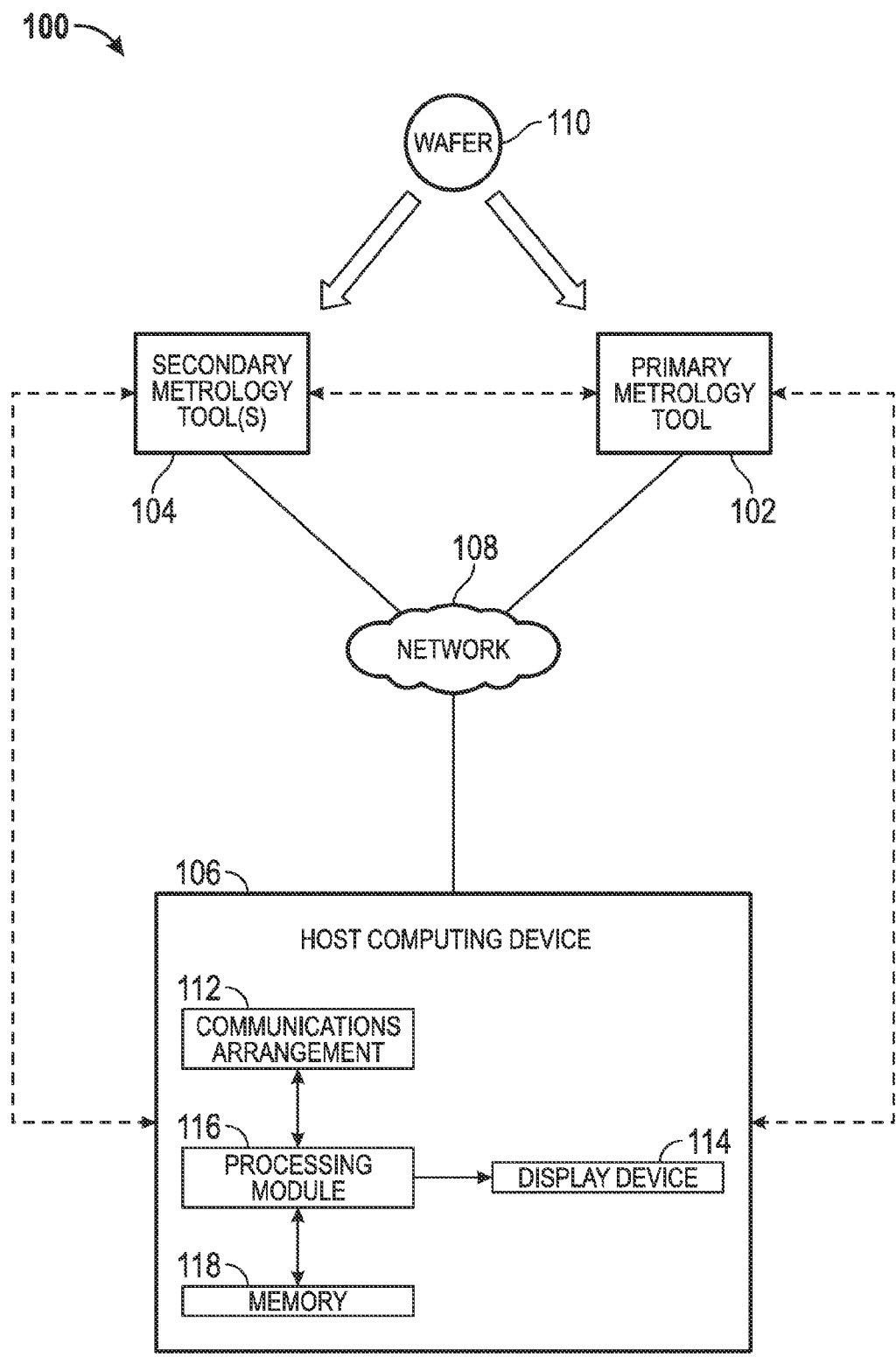
FIG. 1 is a block diagram of an exemplary measurement system.

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the subject matter described herein relate to methods and systems for fabricating semiconductor device structures that involve determining process-enhanced hybrid (or composite) measurements of attributes of semiconductor device structures using measurements obtained from different metrology tools along with process information obtained from one or more processing tools, process control systems, factory control systems, or the like. In this regard, the process information is used to adjust, modify, or otherwise influence feature measurements obtained using metrology tools (or the manner in which those feature measurements obtained using metrology tools are combined) to achieve adjusted feature measurements that are more accurate and/or reliable than an individual feature measurement obtained using an individual metrology tool. Relative to hybrid measurements calculated using measurements obtained from metrology tools, process-enhanced hybrid metrology accounts for additional information or data describing or otherwise quantifying the actual fabrication processes to which a wafer was exposed or otherwise subject to during fabrication of the semiconductor device structure (or the features thereof) along with information or data describing or otherwise quantifying the particular processing tool(s) used for those fabrication processes to provide more accurate and reliable feature measurements while also reducing metrology costs.

Depending on the embodiment, an attribute being measured may be a physical feature, structure or dimension, an absence of a physical feature or structure (e.g., a recess, void or the like), or an intrinsic property (e.g., ion concentration, index of refraction, bulk modulus, electron mobility, or other compositional and/or optical properties). Thus, although the subject matter may be described herein in the context of measuring physical features and/or dimensions of semiconductor device structures, it should be understood that the subject matter is not limited to physical features and/or dimensions and may be utilized to obtain process-enhanced hybrid measurements of intrinsic properties or other attributes of a semiconductor device structure and/or wafer.

Hybrid Metrology

As described in greater detail below in the context of FIGS. 1-6, a hybrid measurement may be calculated using measurements obtained from more than one metrology tool to provide a composite measurement of a particular attribute. For example, in accordance with one or more embodiments, each metrology tool determines measurements of one or more physical features and/or dimensions of a semiconductor device structure based on measurement data measured or otherwise obtained using measurement hardware associated with that metrology tool. The measurements obtained from the different metrology tools are weighted based on their relative accuracy and/or reliability or other characteristics of their respective metrology tool to provide a composite measurement with an accuracy and/or reliability that is greater than the accuracy and/or reliability of the individual measurements obtained by the individual metrology tools.

Turning now to FIG. 1, in an exemplary embodiment, a measurement system 100 includes, without limitation, a plurality of metrology tools 102, 104 communicatively coupled to a host computing device 106 over a communications network 108, such as a computer network (e.g., a wide area network, a wireless local area network, or the like), a cellular network, an ad-hoc or peer-to-peer network, or the like. As described in greater detail below, the metrology tools 102, 104 include hardware capable of measuring physical features, dimensions and/or other attributes of one or more semiconductor device structures formed on a substrate (or wafer) 110 of semiconductor material, wherein measurements obtained by the different metrology tools 102, 104 are utilized to augment one another and obtain hybrid (or composite) measurements of the physical features, dimensions and/or attributes. In this regard, a hybrid measurement is calculated or otherwise determined based on different measurements from different metrology tools 102, 104 and other factors in a manner that achieves a composite measurement for a particular physical feature and/or critical dimension of the device structure(s) on the wafer 110 that is more accurate and/or reliable than an individual measurement for that feature and/or dimension from an individual metrology tool 102, 104. It should be understood that FIG. 1 is a simplified representation of the measurement system 100 for purposes of explanation and ease of description, and FIG. 1 is not intended to limit the subject matter in any way. In this regard, practical embodiments of the measurement system 100 may include any number of metrology tools configured to iteratively exchange measurements any number of times to achieve final hybrid measurements having a desired level of accuracy and/or reliability.

In an exemplary embodiment, after fabrication of one or more physical features of the semiconductor device(s) on the wafer 110, the metrology tools 102, 104 are utilized to measure or otherwise quantify the fabricated dimensions of one or more physical features on the wafer 110 using a measurement technique, such as, for example, scatterometry, scanning electron microscopy, atomic force microscopy, interferometry, reflectometry, ellipsometry, and the like. In this regard, each metrology tool 102, 104 may use a different measurement technique than the other metrology tools 102, 104 in the measurement system 100. In exemplary embodiments, each metrology tool 102, 104 utilizes a non-destructive measurement technique (or technology) so that the wafer 110 is still suitable for its intended operation after being measured. In accordance with one or more embodiments, the host computing device 106 communicates with the metrology tools 102, 104 to signal, command, or otherwise indicate, to a respective metrology tool 102, 104, which features on the wafer 110 are to be measured by that respective metrology tool 102, 104 along with additional information pertaining to how that respective metrology tool 102, 104 should perform the measurement. After a respective metrology tool 102, 104 finishes measuring the physical feature(s) on the wafer 110, the metrology tool 102, 104 may provide the feature measurements to the host computing device 106 and/or another metrology tool 102, 104. In an exemplary embodiment, one metrology tool 102 receives or otherwise obtains the feature measurements from one or more of the other metrology tools 104 for use in determining hybrid measurements for one or more physical feature(s) on the wafer 110, as described in greater detail below. For purposes of explanation, in the context of FIGS. 1-4, the metrology tool 102 which obtains the feature measurements from the other metrology tools 104 and determines final hybrid measurements may be alternatively referred to as the primary metrology tool, while the remaining metrology tool(s) 104 in the measurement system 100 may be alternatively referred to as the secondary metrology tool(s) 104. As described in greater detail below, a secondary metrology tool 104 may also obtain a hybrid measurement determined by the primary metrology tool 102 and potentially other feature measurements from other secondary metrology tool(s) 104 to adjust the feature measurements obtained by the secondary metrology tool 104. Thus, the secondary metrology tool(s) 104 may also determine hybrid (or composite) measurements.

Still referring to FIG. 1, in an exemplary embodiment, the host computing device 106 includes, without limitation, a communications arrangement 112, a display device 114, a processing module 116, and memory 118. The communications arrangement 112 generally represents the hardware, software, firmware and/or a combination thereof which is coupled to the processing module 116 and cooperatively configured to support communications between the host computing device 106 and the metrology tools 102, 104 via the network 108. The display device 114 is realized as an electronic display (e.g., a liquid crystal display (LCD), a light emitting diode (LED) display, or the like) configured to graphically display information and/or content under control of the processing module 116. The processing module 116 generally represents the hardware, firmware, processing logic, and/or other components of the host computing device 106 configured to support operation of the host computing device 106 and execute various functions and/or processing tasks as described in greater detail below. Depending on the embodiment, the processing module 116 may be implemented or realized with a general purpose processor, a microprocessor, a controller, a microcontroller, a state machine, a content addressable memory, an application specific integrated circuit, a field programmable gate array, any suitable programmable logic device, discrete gate or transistor logic, discrete hardware components, or any combination thereof, designed to perform the functions described herein. Furthermore, a method or algorithm described in connection with the embodiments disclosed herein may be embodied directly in hardware, in firmware, in a software module executed by the processing module 116, or in any practical combination thereof. The memory 118 generally represents any non-transitory short or long term storage media capable of storing programming instructions for execution by the processing module 116, including any sort of random access memory (RAM), read only memory (ROM), flash memory, registers, hard disks, removable disks, magnetic or optical mass storage, and/or the like. The programming instructions, when read and executed by the processing module 116, cause the processing module 116 to perform certain tasks, operations, functions, and processes described in more detail below.

Figure 2:
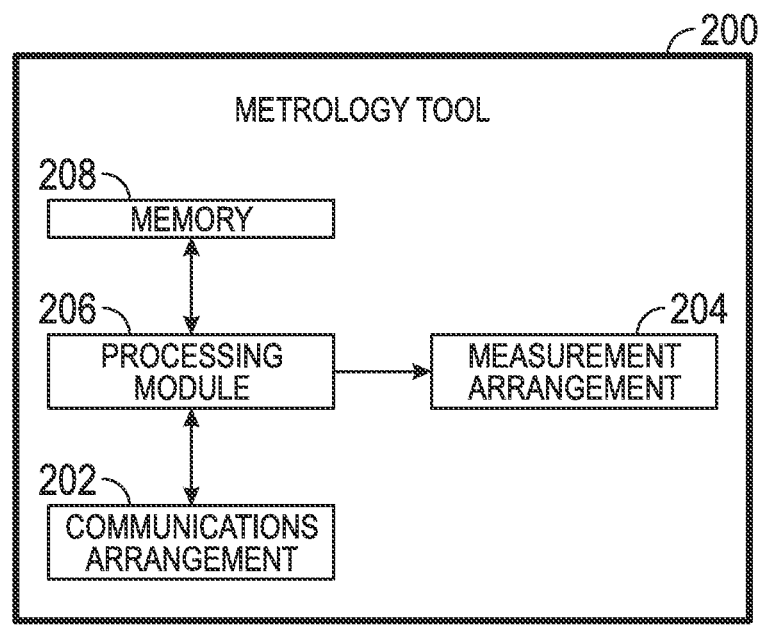
FIG. 2 is a block diagram of an exemplary metrology tool suitable for use in the measurement system of FIG. 1 in accordance with one or more embodiments.

FIG. 2 depicts an exemplary embodiment of a metrology tool 200 suitable for use as a metrology tool 102, 104 in the measurement system 100 of FIG. 1. The illustrated metrology tool 200 includes, without limitation, a communications arrangement 202, a measurement arrangement 204, a processing module 206, and memory 208. It should be understood that FIG. 2 is a simplified representation of the metrology tool 200 for purposes of explanation and ease of description, and FIG. 2 is not intended to limit the subject matter in any way.

In the illustrated embodiment, the communications arrangement 202 generally represents the hardware, software, firmware and/or combination thereof which are coupled to the processing module 206 and cooperatively configured to support communications to/from the metrology tool 200 via a network (e.g., network 108) in a conventional manner. The measurement arrangement 204 generally represents the combination of radiation sources, illumination devices, electron guns, sensors, detectors, optics, and/or other hardware components of the metrology tool 200 which are utilized to measure physical features, dimensions and/or other attributes of semiconductor devices on a wafer. In accordance with one or more embodiments, the measurement arrangement 204 is capable of transmitting, emitting, or otherwise directing a reference signal towards a wafer and sensing, receiving, or otherwise measuring a response signal from the wafer. In this regard, the physical features, dimensions and/or other attributes of the wafer modulate or otherwise influence characteristics of the reference signal resulting in the response signal that is sensed or otherwise received by the measurement arrangement 204. Thus, the response signal corresponds to raw feature measurement data that is indicative of the dimensions of the various physical features, dimensions and/or other attributes on the wafer 110, which can be determined based on characteristics of the response signal (e.g., the spectral characteristics, waveforms, or the like) or the relationship between the response signal and the reference signal.

The processing module 206 generally represents the hardware, firmware, processing logic, and/or other components of the metrology tool 200 configured to control or otherwise operate the measurement arrangement 204 to measure physical features and/or dimensions on a wafer, communicate feature measurements to/from the metrology tool 200, store feature measurements in the memory 208, and execute various functions and/or processing tasks as described in greater detail below. Depending on the embodiment, the processing module 206 may be implemented or realized with a general purpose processor, a microprocessor, a controller, a microcontroller, a state machine, a content addressable memory, an application specific integrated circuit, a field programmable gate array, any suitable programmable logic device, discrete gate or transistor logic, discrete hardware components, or any combination thereof, designed to perform the functions described herein. Furthermore, the steps of a method or algorithm described in connection with the embodiments disclosed herein may be embodied directly in hardware, in firmware, in a software module executed by the processing module 206, or in any practical combination thereof. The memory 208 represents any non-transitory short or long term storage media capable of storing programming instructions for execution by the processing module 206, which, when read and executed by the processing module 206, cause the processing module 206 to perform certain tasks, operations, functions, and processes described in more detail herein. In accordance with one or more embodiments, the memory 208 also stores feature measurements obtained using the measurement arrangement 204 and/or feature measurements obtained from other metrology tools, as described in greater detail below.

Figure 3:
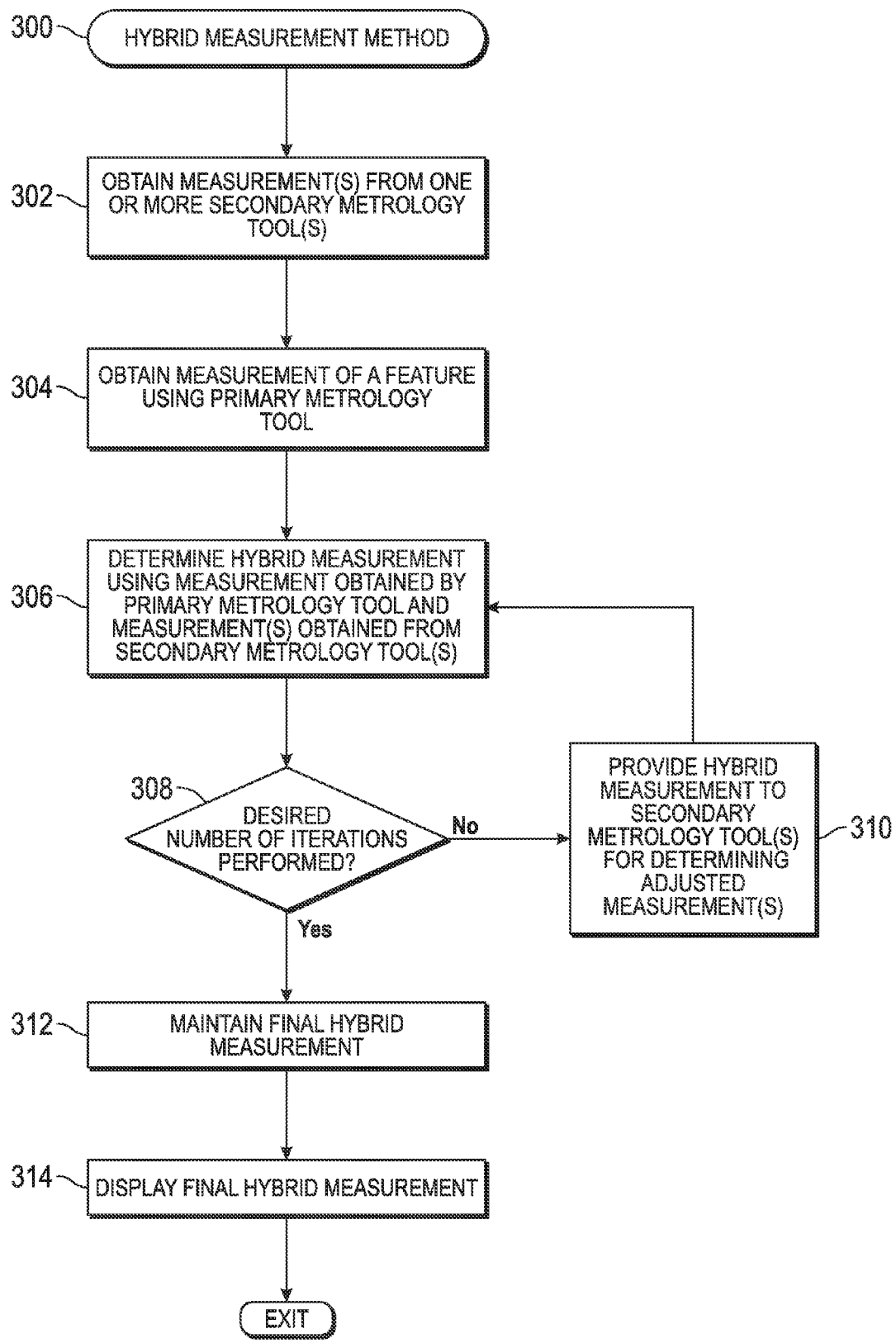
FIG. 3 is a flow diagram of an exemplary hybrid measurement method suitable for use with the measurement system of FIG. 1 in an exemplary embodiment.

FIG. 3 depicts an exemplary hybrid measurement method 300 suitable for implementation by a measurement system 100 to obtain hybrid measurements of physical features and/or dimensions of semiconductor devices. The various tasks performed in connection with the hybrid measurement method 300 may be performed by software, hardware, firmware, or any combination thereof. For illustrative purposes, the following description refers to elements mentioned above in connection with FIGS. 1-2. In practice, portions of the hybrid measurement method 300 may be performed by different elements of the measurement system 100, such as, for example, the primary metrology tool 102, the secondary metrology tool(s) 104, and/or the host computing device 106. It should be appreciated that the hybrid measurement method 300 may include any number of additional or alternative tasks, the tasks need not be performed in the illustrated order and/or the tasks may be performed concurrently, and/or the hybrid measurement method 300 may be incorporated into a more comprehensive procedure or process having additional functionality not described in detail herein. Moreover, one or more of the tasks shown and described in the context of FIG. 3 could be omitted from a practical embodiment of the hybrid measurement method 300 as long as the intended overall functionality remains intact.

Referring to FIG. 3, and with continued reference to FIGS. 1-2, in an exemplary embodiment, the hybrid measurement method 300 involves obtaining measurements for one or more physical features, dimensions and/or other attributes on a wafer from one or more secondary metrology tool(s) (task 302). For example, after the physical features and/or dimensions to be measured have been fabricated, the wafer 110 is placed in a chamber proximate to or otherwise associated with a secondary metrology tool 104 such that the wafer 110 is aligned with the measurement arrangement 204 of the secondary metrology tool 104. In accordance with one or more embodiments, the secondary metrology tool 104 notifies the host computing device 106 of the presence of the wafer 110, wherein the host computing device 106 provides commands and/or instructions to the secondary metrology tool 104 to initiate measurement of the semiconductor device structures on the wafer 110. In response to receiving commands and/or instructions from the host computing device 106, the processing module 206 of the secondary metrology tool 104 signals or otherwise operates the measurement arrangement 204 to measure the physical features and/or dimensions on the wafer 110 in the manner indicated by the host computing device 106. As described above, in accordance with one or more embodiments, to measure physical features and/or dimensions on the wafer 110, the measurement arrangement 204 transmits or otherwise directs a reference signal towards the wafer 110, wherein the physical features of the wafer 110 modulate or otherwise influence the reference signal resulting in a response signal that is sensed or otherwise received by the measurement arrangement 204. The processing module 206 receives or otherwise obtains the raw feature measurement data from the measurement arrangement 204, calculates or otherwise determines measurements for the corresponding physical features and/or critical dimensions on the wafer 110 based on characteristics of the response signal (e.g., the response signal spectra, waveforms, or the like), and stores or otherwise maintains the feature measurements in memory 208. The secondary metrology tool 104 communicates or otherwise provides the obtained feature measurements to the host computing device 106 and/or the primary metrology tool 102 for use in determining hybrid measurements for physical features and/or critical dimensions on the wafer 110, as described in greater detail below.

In an exemplary embodiment, the hybrid measurement method 300 also obtains measurements for one or more physical features, dimensions and/or other attributes on a wafer from the primary metrology tool (task 304). In a similar manner as described above, the wafer 110 is placed in a chamber proximate to or otherwise associated with a primary metrology tool 102 such that the wafer 110 is aligned with the measurement arrangement 204 of the primary metrology tool 102, and the host computing device 106 provides commands and/or instructions to the primary metrology tool 102 regarding which physical features and/or dimensions on the wafer 110 should be measured. In response to receiving commands and/or instructions from the host computing device 106, the processing module 206 of the primary metrology tool 102 signals or otherwise operates the measurement arrangement 204 to measure the physical features and/or dimensions on the wafer 110 in the manner indicated by the host computing device 106. The processing module 206 of the primary metrology tool 102 receives or otherwise obtains the raw feature measurement data from the measurement arrangement 204, calculates or otherwise determines measurements for the physical features and/or critical dimensions on the wafer 110 utilizing the raw feature measurement data, and stores or otherwise maintains the feature measurements in its memory 208.

In an exemplary embodiment, the hybrid measurement method 300 continues by calculating or otherwise determining hybrid measurements for one or more physical features, dimensions and/or other attributes of the wafer based on the feature measurements obtained using the secondary metrology tool(s) and the feature measurements obtained using the primary metrology tool (task 306). In an exemplary embodiment, the hybrid feature measurements for a particular feature and/or dimension are calculated as a function of the measurement for that feature and/or dimension obtained using the primary metrology tool 102 and one or more feature measurements from one or more secondary metrology tool(s) 104. The secondary metrology tool feature measurement(s) used in determining a hybrid measurement for a feature may be for that feature or a different feature on the wafer 110. In an exemplary embodiment, the primary metrology tool 102 and/or the host computing device 106 determines the hybrid measurement for a particular feature and/or dimension by weighting the primary metrology tool feature measurement and the secondary metrology tool feature measurement(s) in accordance with their relative accuracy and/or reliability. For example, as described in greater detail below in the context of FIG. 4, for each respective secondary metrology tool 104, the metrology tool 102 and/or the host computing device 106 may determine a weighting factor representative of the relative quality of feature measurements from that secondary metrology tool 104 with respect to the metrology tool 102 and/or the other secondary metrology tools 104 in the measurement system 100. In this regard, the quality weighting factor for a particular metrology tool 102, 104 may be based on or influenced by the total measurement uncertainty (TMU) and/or reference measurement system uncertainty (RMSU) of the respective metrology tool 102, 104 along with other characteristics of the respective metrology tool 102, 104 that may influence measurement quality.

In accordance with one embodiment, the metrology tool 102 and/or the host computing device 106 calculates the hybrid measurement for a particular feature on the wafer 110 as a weighted sum of the feature measurements from the secondary metrology tool(s) 104 and the primary metrology tool 102 using the quality weighting factors. For example, for a particular critical dimension measured by the primary metrology tool 102 and a secondary metrology tool 104, the metrology tool 102 may calculate a hybrid measurement of a critical dimension (CD) using the equation $CD_H = \gamma_{S1} CD_S + \gamma_{P1} CD_P$, where $CD_S$ is the measurement for the critical dimension that was determined or otherwise measured by the secondary tool 104, $CD_P$ is the measurement for the critical dimension that was determined or otherwise measured by the primary metrology tool 102, $\gamma_{S1}$ is the quality weighting factor associated with the secondary metrology tool 104 determined by the primary metrology tool 102, and $\gamma_{P1}$ is the quality weighting factor associated with the primary metrology tool 102. In one embodiment, the sum of the quality weighting factors is equal to one, where $\gamma_{P1} = 1 - \gamma_{S1}$, such that the quality weighting factor associated with the primary metrology tool corresponds to and compensates for the relative difference between the secondary tool feature measurement (e.g., $CD_S$) and the weighted secondary tool feature measurement (e.g., $\gamma_{S1} CD_S$). As described above, in some embodiments, the secondary tool feature measurement may be for a different physical feature and/or dimension than the primary tool feature measurement. For example, the secondary metrology tool 104 may be realized as an atomic force microscopy (AFM) tool that measures a sidewall angle of a gate structure fabricated on the wafer 110 and the primary metrology tool 102 may be realized as an optical critical dimension (OCD) tool that measures a gate dielectric undercut and determines a hybrid measurement for the gate dielectric undercut based on its own measurement of the gate dielectric undercut and the measurement of the gate sidewall angle obtained from the AFM metrology tool.

Still referring to FIG. 3, in an exemplary embodiment, the hybrid measurement method 300 continues by identifying or otherwise determining whether a desired number of iterations have been performed, and when the desired number of iterations have not been performed, providing the hybrid measurement(s) to one or more of the secondary metrology tool(s) for adjusting the feature measurements obtained by the respective secondary metrology tool (tasks 308, 310). For example, in accordance with one or more embodiments, after the primary metrology tool 102 calculates hybrid measurements using the feature measurements measured by the metrology tool 102 and feature measurements measured by the secondary metrology tool(s) 104, the metrology tool 102 provides the hybrid measurements for the physical features and/or dimensions on the wafer 110 to the host computing device 106. When the host computing device 106 determines that a desired number of iterations have not been performed, the host computing device 106 either transmits the hybrid measurements obtained from the metrology tool 102 to one or more of the secondary metrology tools 104 or the host computing device 106 signals the metrology tool 102 to transmit the hybrid measurement to the one or more secondary metrology tools 104. After the secondary metrology tool 104 obtains the hybrid measurement for a particular physical feature and/or dimension from the primary metrology tool 102, the secondary metrology tool 104 calculates or otherwise determines an adjusted measurement for a particular physical feature and/or dimension (which may or may not be the same feature corresponding to the hybrid measurement) using the hybrid measurement determined by the primary metrology tool 102 and the previous feature measurement measured by the secondary metrology tool 104 (e.g., the feature measurement previously calculated using the raw feature measurement data obtained using its measurement arrangement 204). In this regard, in a similar manner as described above, the secondary metrology tool 104 may determine quality weighting factors and calculate the adjusted feature measurement as a weighted sum of the hybrid feature measurement determined by the primary metrology tool 102 and the feature measurement obtained using its own measurement hardware. Thus, the hybrid measurement determined by the primary metrology tool 102 is utilized to augment or otherwise modify the feature measurements determined by the secondary tool 104. For example, the secondary metrology tool 104 may calculate an adjusted measurement of the critical dimension (CD) using the equation $CD_{S\_ADJ} = \gamma_{S2} CD_S + \gamma_{P2} CD_H$, where $CD_S$ is the previous measurement for the critical dimension determined by the secondary metrology tool 104, $CD_H$ is the hybrid measurement for the critical dimension that was determined by the primary metrology tool 102, $\gamma_{S2}$ is the quality weighting factor associated with the secondary metrology tool 104 determined by the secondary metrology tool 104, and $\gamma_{P2}$ is the quality weighting factor associated with the primary metrology tool 102 determined by the secondary metrology tool 104. In this regard, the adjusted secondary metrology tool feature measurement is also a hybrid (or composite) feature measurement.

After a secondary metrology tool determines an adjusted feature measurement, the hybrid measurement method 300 repeats the step of determining a hybrid measurement for that physical feature and/or dimension based on the adjusted feature measurements determined by the secondary metrology tool(s) 104 (task 306). In this regard, the primary metrology tool 102 obtains an adjusted feature measurement from a secondary metrology tool 104 and calculates an adjusted hybrid feature measurement as a function of the adjusted feature measurement and the previous feature measurement determined by the metrology tool 102. In one or more embodiments, the metrology tool 102 calculates the adjusted hybrid measurement as a weighted sum of the previous feature measurement determined by the primary metrology tool 102 and the adjusted feature measurement determined by the secondary metrology tool 104. For example, the metrology tool 102 may calculate an adjusted hybrid measurement of a critical dimension (CD) using the equation $CD_{H\_ADJ} = \gamma_{S1} CD_{S\_ADJ} + \gamma_{P1} CD_P$, where $CD_{S\_ADJ}$ is the adjusted measurement for the critical dimension determined by the secondary metrology tool 104, $CD_P$ is the measurement for the critical dimension that was obtained using the measurement hardware of the primary metrology tool 102. In this manner, the adjusted secondary metrology tool feature measurement augments or otherwise modifies the hybrid measurement determined by the primary metrology tool 102.

In an exemplary embodiment, the hybrid measurement method 300 repeats the steps of iteratively adjusting the secondary metrology tool measurements and determining updated hybrid feature measurements until a desired number of iterations have been performed (tasks 306, 308, 310). In this regard, the desired number of iterations to be performed is chosen to achieve final hybrid feature measurements having a desired level of accuracy and/or reliability. For example, in one or more embodiments, the metrology tool 102 provides the hybrid feature measurements determined at the end of each iteration to the host computing device 106. In accordance with one exemplary embodiment, the host computing device 106 determines that the desired number iterations have been performed when the difference between successive hybrid feature measurements provided by the primary metrology tool 102 is less than a threshold amount. For example, when a hybrid feature measurement determined by the metrology tool 102 differs from the previous hybrid feature measurement provided by the metrology tool 102 by less than a threshold amount (e.g., a percentage of the previous hybrid feature measurement or a fixed amount), the host computing device 106 commands, signals, or otherwise indicates to the metrology tools 102, 104 that the desired number of iterations have been performed. In other embodiments, the host computing device 106 counts or otherwise monitors the number of iterations performed by the metrology tool 102 and commands, signals, or otherwise indicates to the metrology tools 102, 104 that the desired number of iterations have been performed when the counted number of iterations exceeds a threshold number chosen to result in hybrid measurements with a desired accuracy and/or reliability. After the desired number of iterations have been performed, the hybrid measurement method 300 stores or otherwise maintains the final hybrid measurements for the physical features and/or dimensions of the semiconductor devices on the wafer 110 in memory and displays or otherwise presents the final hybrid measurements to the user (tasks 312, 314). In this regard, the processing module 116 stores the final hybrid measurements obtained from the metrology tool 102 in memory 118, and when a user subsequently accesses the host computing device 106 to view measurements for the physical features and/or dimensions on the wafer 110, the processing module 116 presents or otherwise displays the final hybrid measurements (or a graphical representation thereof) on the display device 114.

Figure 4:
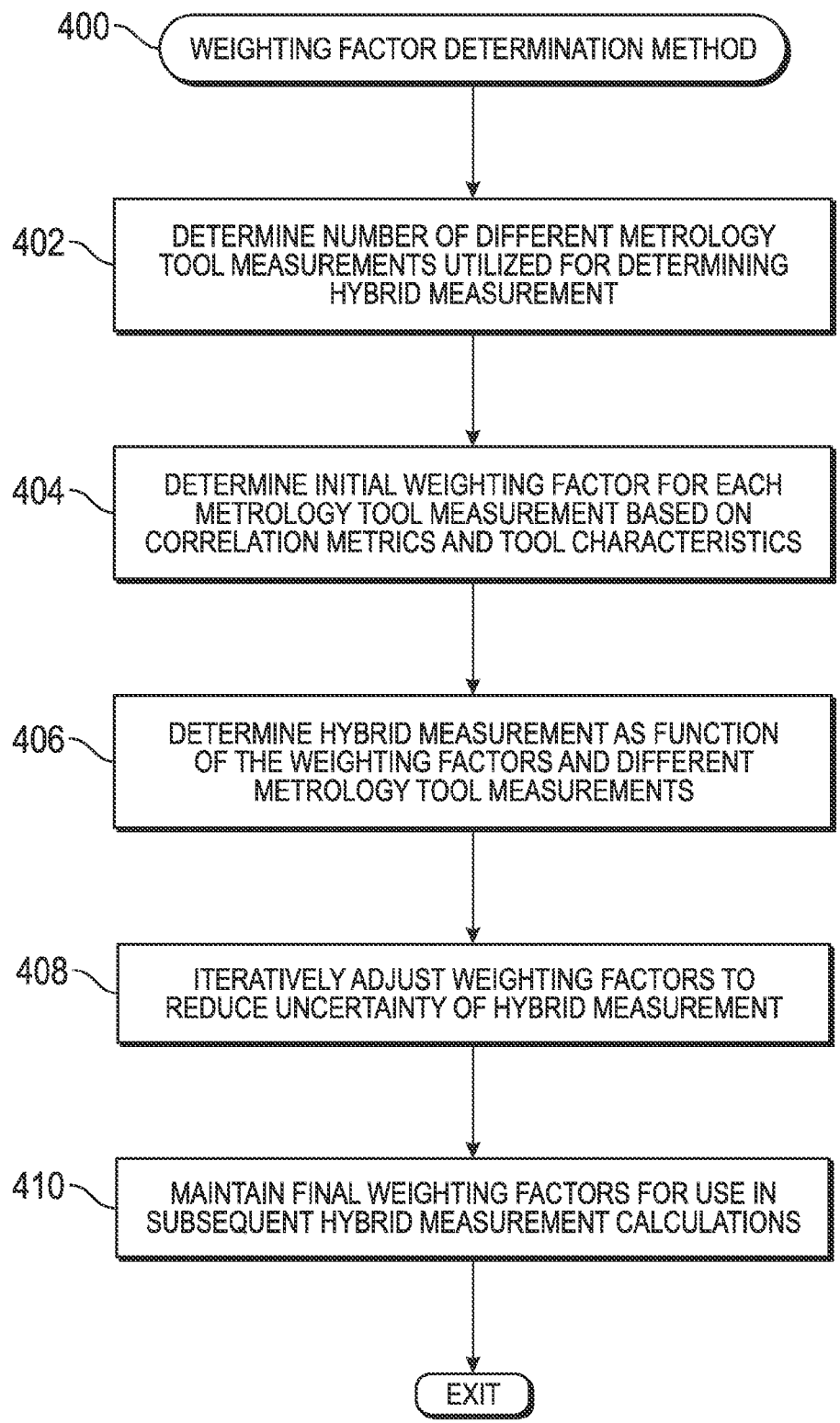
FIG. 4 is a flow diagram of an exemplary weighting factor determination method suitable for use in the measurement system of FIG. 1 in connection with the hybrid measurement method of FIG. 3 in accordance with one or more embodiments.

FIG. 4 depicts an exemplary weighting factor determination method 400 suitable for implementation by a measurement system 100 in connection with the hybrid measurement method 300 of FIG. 3 to determine quality weighting factors. The various tasks performed in connection with the weighting factor determination method 400 may be performed by software, hardware, firmware, or any combination thereof. For illustrative purposes, the following description refers to elements mentioned above in connection with FIGS. 1-2. In practice, portions of the weighting factor determination method 400 may be performed by different elements of the measurement system 100, such as, for example, the primary metrology tool 102, the secondary metrology tool(s) 104, and/or the host computing device 106. It should be appreciated that the weighting factor determination method 400 may include any number of additional or alternative tasks, the tasks need not be performed in the illustrated order and/or the tasks may be performed concurrently, and/or the weighting factor determination method 400 may be incorporated into a more comprehensive procedure or process having additional functionality not described in detail herein. Moreover, one or more of the tasks shown and described in the context of FIG. 4 could be omitted from a practical embodiment of the weighting factor determination method 400 as long as the intended overall functionality remains intact.

In an exemplary embodiment, the weighting factor determination method 400 begins by determining or otherwise identifying the number of different feature measurements from different metrology tools to be utilized by a particular tool in determining a hybrid measurement (task 402). For example, the primary metrology tool 102 may identify the total number of secondary metrology tools 104 in the system as the number of different feature measurements to be utilized by the metrology tool 102 when determining hybrid measurements. After identifying the number of different feature measurements to be utilized, the weighting factor determination method 400 continues by determining initial quality weighting factors for each respective feature measurement based on correlation metrics for the respective feature measurement and/or characteristics of the metrology tool associated with the respective feature measurement (task 404). In accordance with one embodiment, the metrology tool 102 determines a numerical range for the quality weighting factors, and then determines, for each respective feature measurement, an initial quality weighting factor value based on one or more correlation metrics (e.g., TMU, RMSU, $R^2$ values or other correlation coefficients, and the like) associated with that feature measurement and/or one or more characteristics of the secondary metrology tool 104 (e.g., FMP or other tool matching metrics, the precision of the tool, the throughput of the tool, the configuration and/or type of tool, the age of the tool, performance characteristics of the measurement arrangement, and the like) providing that feature measurement that are likely to impact the reliability of that feature measurement. In other words, each quality weighting factor is determined as a function of one or more correlation metrics and/or one or more characteristics of the respective metrology tool providing that feature measurement to reduce or otherwise eliminate measurement noise and thereby improve the metrology performance of the hybrid measurement using that feature measurement. The initial quality weighting factor associated with a feature measurement provided by a first secondary metrology tool 104 may be greater than the initial quality weighting factor associated with a feature measurement provided by a second secondary metrology tool 104 when the correlation metric(s) and/or tool characteristic(s) of the first secondary metrology tool 104 are indicative of the measurements from the first secondary metrology tool 104 being more accurate than measurements from the second secondary metrology tool 104, and vice versa.

Still referring to FIG. 4, in an exemplary embodiment, after determining initial quality weighting factors for the different measurements, the weighting factor determination method 400 continues by determining an initial hybrid measurement as a function of the initial quality weighting factors and different measurements from the different metrology tools (task 406). For example, the metrology tool 102 determines an initial hybrid measurement for a physical feature and/or dimension as a function of the measurement for that feature and/or dimension obtained using the metrology tool 102, the quality weighting factor associated with the metrology tool 102, one or more additional measurements obtained from one or more of the secondary metrology tools 104, and the initial quality weighting factors associated with those one or more additional measurements and/or secondary metrology tools 104 in a similar manner as described above. After determining an initial hybrid measurement, the weighting factor determination method 400 continues by iteratively adjusting the quality weighting factors to reduce the uncertainty of the hybrid measurement by reducing the difference between the hybrid measurement and a reference measurement (task 408). In this regard, the equation and/or function used to calculate a hybrid measurement is optimized by adjusting the different weighting factors used to calculate the hybrid measurement. For example, in accordance with one embodiment, a reference measurement for the physical feature and/or dimension may be obtained using a highly accurate metrology, such as transmission electron microscopy (TEM). Using the reference measurement, the metrology tool 102 may iteratively adjust one or more of the quality weighting factors associated with one or more of the measurements obtained from the secondary metrology tools 104 to reduce or eliminate the difference between the hybrid measurement calculated by the metrology tool 102 and the reference measurement. In this regard, in some embodiments, the metrology tool 102 may modify any equations and/or functions used to determine the initial quality weighting factors so that those equations and/or functions provide different quality weighting factor values that reduce the difference (or error) between the hybrid measurement and the reference measurement. In other embodiments, the metrology tool 102 may determine the hybrid measurement multiple times using different feature measurement values obtained using the metrology tools 102, 104 (e.g., by measuring the same wafer and/or semiconductor devices multiple times), wherein the metrology tool 102 iteratively adjusts the quality weighting factors to reduce or eliminate the difference between the different hybrid measurements calculated by the metrology tool 102. In other words, the metrology tool 102 quality weighting factors are iteratively adjusted so that the different hybrid measurements converge to reduce the difference between the different hybrid measurements until the difference between the different hybrid measurements is below a threshold amount. In this regard, a previous and/or subsequent hybrid measurement functions as a reference measurement when adjusting the quality weighting factors.

After iteratively adjusting the quality weighting factors to optimize the hybrid measurement calculation, the weighting factor determination method 400 continues by maintaining the final quality weighting factors for use in subsequent hybrid measurement determinations (task 410). In an exemplary embodiment, the metrology tool 102 stores the final quality weighting factors (or the final quality weighting factor equations and/or functions) resulting from the iterative adjustments in its memory 208 for use in calculating subsequent hybrid measurements, as described above in the context of the hybrid measurement method 300. In other embodiments, the metrology tool 102 may provide the final quality weighting factors to the host computing device 106, which maintains the quality weighting factors in memory 118. In an exemplary embodiment, the weighting factor determination method 400 is performed for each different hybrid measurement determined by a metrology tool 102, 104 and/or the host computing device 106, including the adjusted measurements determined by the secondary metrology tools 104 and/or the host computing device 106, as described above.

With the hybrid measurement method 300 and the weighting factor determination method 400, accurate and/or reliable hybrid measurements for physical features and/or dimensions on a wafer are determined using measurements from different metrology tools, which might otherwise provide less accurate and/or less reliable measurements. To put it another way, composite measurements determined as a function of measurements from different non-destructive metrology tools may achieve a level of accuracy and/or reliability on par with highly accurate metrology tools which require longer amounts of measurement time and/or rely on destructive metrology techniques. Thus, highly accurate measurements can be obtained in a reduced amount of time and in a non-destructive manner by combining independent measurements from different metrology tools, as described above, thereby allowing a foundry or other fabrication entity to achieve a higher yield. For example, a foundry may fabricate a particular physical feature and/or dimension of interest for a semiconductor device or integrated circuit on a wafer of semiconductor material using conventional semiconductor fabrication techniques and utilize multiple metrology tools to measure that physical feature and/or dimensions and determine a hybrid measurement of that physical feature and/or dimension which is accurate and/or reliable without utilizing a destructive metrology technique (e.g., TEM or the like), thereby allowing the semiconductor device structure to function in the desired manner after being measured.

Automated Hybrid Metrology

As described in greater detail below in the context of FIGS. 5-6, an automated fabrication system may include a hybrid measurement system, which consists of a plurality of metrology tools cooperatively configured to determine a hybrid measurement of a feature of a semiconductor device structure fabricated on a wafer of semiconductor material by a preceding processing tool in accordance with a hybrid recipe. The hybrid recipe may be determined substantially in real-time (e.g., after the immediately preceding processing step is completed) based on physical characteristics and/or material properties of the features fabricated on the wafer and performance characteristics of the metrology tools to determine a measurement sequence (or sampling plan) and related hybridization algorithms that are likely to provide an accurate hybrid measurement of the feature of interest. After the hybrid recipe is determined, the measurement recipes of the individual metrology tools may be modified or otherwise configured to implement the hybrid recipe and the fabrication automation system may be configured to automatically transfer the wafer from the preceding processing tool through the metrology tools in accordance with the measurement sequence. In this regard, each metrology tool automatically executes its respective measurement recipe upon receiving the wafer to obtain measurements of the semiconductor device structure on the wafer, and provides its measurements to a host computing device and/or another metrology tool for influencing that metrology tool's measurements. After the measurements are obtained from the plurality of metrology tools in accordance with the hybrid recipe (e.g., in the order defined by the measurement sequence), the hybrid measurement of the feature of interest is calculated or otherwise determined based on the measurements from the individual metrology tools. The final hybrid measurement of the feature of interest may be provided to the fabrication automation system and/or one or more subsequent processing tools to influence or otherwise modify subsequent processing steps for the wafer and arrive at a final semiconductor device structure on the wafer having the intended feature dimensions and performance characteristics.

Figure 5:
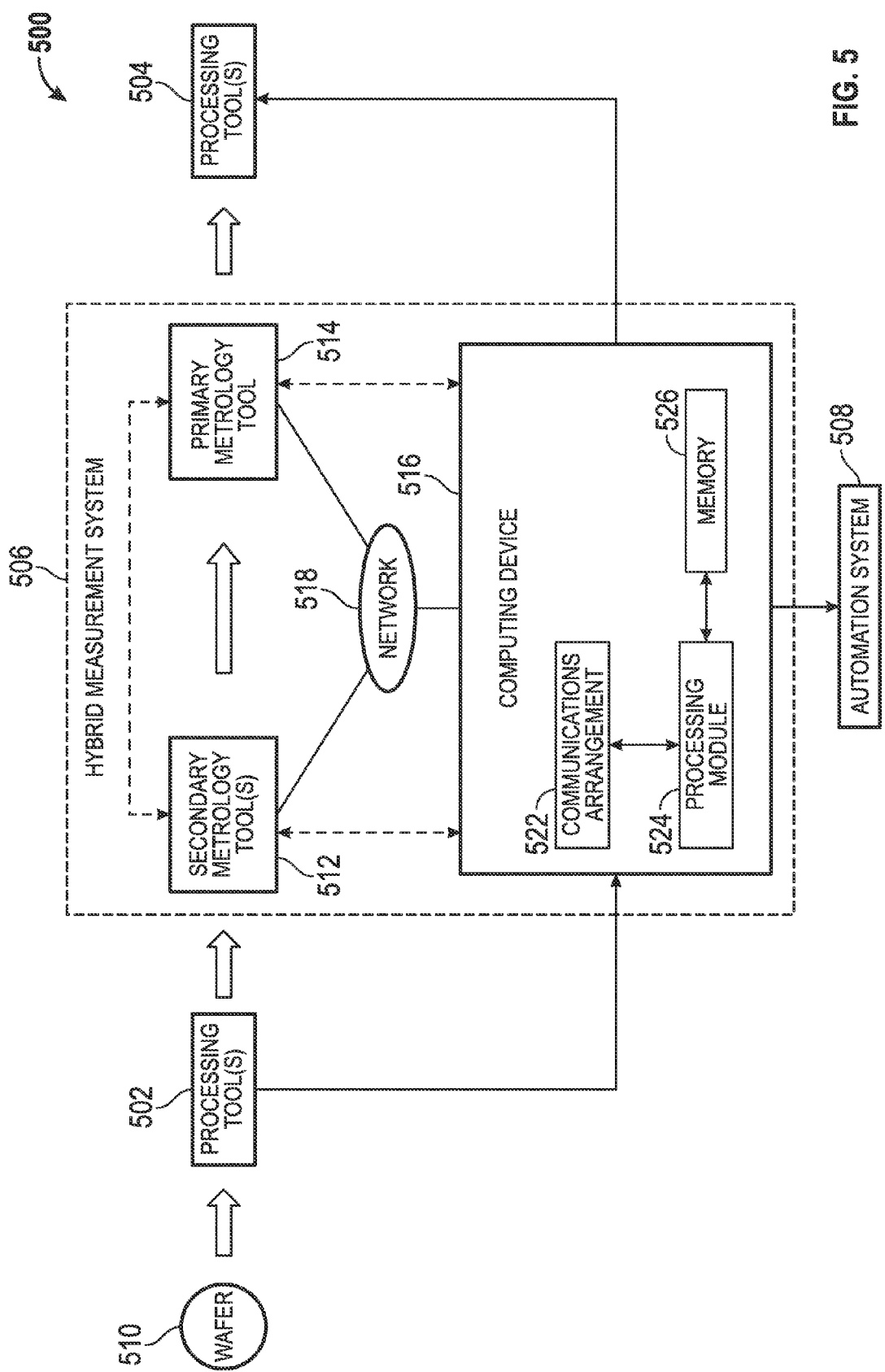
FIG. 5 is a block diagram of an exemplary fabrication system.

Referring now to FIG. 5, in an exemplary embodiment, a fabrication system 500 includes, without limitation, a plurality of processing tools 502, 504, a fabrication automation system 508, and a hybrid measurement system 506 communicatively coupled to one or more of the processing tools 502, 504 and the fabrication automation system 508. The hybrid measurement system 506 includes, without limitation, a plurality of metrology tools 512, 514 and a host computing device 516 communicatively coupled over a communications network 518, such as a computer network (e.g., a wide area network, a wireless local area network, or the like), a cellular network, an ad-hoc or peer-to-peer network, or the like. As described in greater detail below, the metrology tools 512, 514 include hardware capable of measuring physical features, dimensions and/or other attributes of one or more semiconductor device structures formed on a substrate (or wafer) 510 of semiconductor material by one or more processing tools 502 preceding the hybrid measurement system 506, wherein measurements obtained by the different metrology tools 512, 514 are utilized to augment one another and obtain hybrid (or composite) measurements of the physical features, dimensions and/or attributes. In this regard, a hybrid measurement is calculated or otherwise determined based on different measurements from different metrology tools 512, 514 in a manner that achieves a composite measurement for a particular physical feature and/or critical dimension of the device structure(s) on the wafer 510 that is more accurate and/or reliable than an individual measurement for that feature and/or dimension that would be obtained from an individual metrology tool 512, 514. In one or more embodiments, the hybrid measurement(s) determined by the hybrid measurement system 506 are provided to or otherwise utilized by one or more subsequent processing tool(s) 504 to influence the manner in which the subsequent processing tool(s) 504 fabricate additional physical features, dimensions and/or other attributes on the wafer 510. Additionally, in some embodiments, the hybrid measurement(s) determined by the hybrid measurement system 506 may also be provided to and/or utilized by one or more preceding processing tool(s) 502 to influence fabrication of subsequent wafers.

In the illustrated embodiment of FIG. 5, the fabrication automation system 508 includes the robotics and other components of the fabrication system 500 that are configured to automatically transfer the wafer 510 to/from the processing tools 502, 504 and metrology tools 512, 514. In exemplary embodiments, the fabrication automation system 508 initially provides the wafer 510 to one or more processing tools 502, such as, for example, deposition tools, etching tools, annealing tools, and the like, to fabricate one or more physical features, dimensions and/or structures of a semiconductor device on the wafer 510. After fabrication of those features on the wafer 510, the fabrication automation system 508 provides the wafer 510 to the hybrid measurement system 506 for measuring or otherwise quantifying the fabricated dimensions of various features on the wafer 510 using a plurality of different measurement techniques, such as, for example, scatterometry, scanning electron microscopy, atomic force microscopy, interferometry, reflectometry, ellipsometry, and the like. In this regard, each metrology tool 512, 514 may use a different measurement technique than the other metrology tools 512, 514 in the hybrid measurement system 506. In exemplary embodiments, each metrology tool 512, 514 utilizes a non-destructive measurement technique (or technology) so that semiconductor devices fabricated on the wafer 510 are still suitable for their intended purpose after the wafer 510 is measured.

As described in greater detail below, in exemplary embodiments, the computing device 516 is communicatively coupled to one or more of the preceding processing tools 502

(e.g., via network 518) to obtain information pertaining to the physical features, structures and/or dimensions fabricated on the wafer 510 by the respective processing tool 502, identifies the physical characteristics and/or material properties of the feature(s) on the wafer 510 to be measured by the hybrid measurement system 506, and determines a hybrid recipe for measuring the identified feature(s) on the wafer 510. In this regard, the hybrid recipe is a collection of commands or instructions that dictate the order in which the wafer 510 is to be measured by the individual metrology tools 512, 514 and the manner in which each individual metrology tool 512, 514 measures the wafer 510 and/or utilizes measurements from another metrology tool 512, 514 to influence its measurement. To implement the hybrid recipe, the computing device 516 communicates with a respective metrology tool 512, 514 (e.g., via the network 518) to modify the measurement recipe maintained by that respective metrology tool 512, 514 to indicate which features on the wafer 510 are to be measured by that respective metrology tool 512, 514 along with additional information pertaining to how that respective metrology tool 512, 514 should perform the measurement, how that respective metrology tool 512, 514 should utilize measurements obtained by other metrology tools 512, 514, and which of the other metrology tools 512, 514 that the respective metrology tool 512, 514 should provide its measurements to. For purposes of explanation, in the context of FIGS. 5-6, the metrology tool 514 which measures the wafer 510 last in the measurement sequence defined by the hybrid recipe may be alternatively referred to as the primary metrology tool, while the preceding metrology tool(s) 512 in the hybrid measurement system 506 may be alternatively referred to as the secondary metrology tool(s) 512. To implement the hybrid recipe, the computing device 516 also signals, commands, or otherwise instructs the fabrication automation system 508 to transfer the wafer 510 from a preceding processing tool 502 to the appropriate secondary metrology tool(s) 512 in the order specified by the measurement sequence of the hybrid recipe, prior to transferring the wafer to the primary metrology tool 514 and subsequent processing tools 504.

As described in greater detail below, after a secondary metrology tool 512 finishes measuring physical feature(s) and/or other attributes of the wafer 510, the secondary metrology tool 512 provides its feature measurements to the host computing device 516 and/or another metrology tool 512, 514. In an exemplary embodiment, the primary metrology tool 514 receives or otherwise obtains measurements from one or more of the secondary metrology tools 512 for use in determining hybrid measurements for one or more physical feature(s) on the wafer 510, as described in greater detail below. In some embodiments, the final hybrid feature measurements may be determined iteratively, wherein a secondary metrology tool 512 obtains a hybrid measurement determined by the primary metrology tool 514 and potentially other feature measurements from other secondary metrology tool(s) 512 to adjust the feature measurements obtained by that secondary metrology tool 512, with the adjusted feature measurement for that secondary metrology tool 512 being utilized to determine the final hybrid feature measurement. Thus, the secondary metrology tool(s) 512 may also determine hybrid (or composite) measurements.

Still referring to FIG. 5, in an exemplary embodiment, the host computing device 516 includes, without limitation, a communications arrangement 522, a processing module 524, and memory 526. The communications arrangement 522 generally represents the hardware, software, firmware and/or combination thereof which are coupled to the processing module 524 and cooperatively configured to support communications between the host computing device 516 and the metrology tools 512, 514 via the network 518. In exemplary embodiments, the communications arrangement 522 also supports communications to/from the processing tools 502, 504 and the fabrication automation system 508. The processing module 524 generally represents the hardware, firmware, processing logic, and/or other components of the host computing device 516 configured to support operation of the host computing device 516 and execute various functions and/or processing tasks as described in greater detail below. Depending on the embodiment, the processing module 524 may be implemented or realized with a general purpose processor, a microprocessor, a controller, a microcontroller, a state machine, a content addressable memory, an application specific integrated circuit, a field programmable gate array, any suitable programmable logic device, discrete gate or transistor logic, discrete hardware components, or any combination thereof, designed to perform the functions described herein. Furthermore, the steps of a method or algorithm described in connection with the embodiments disclosed herein may be embodied directly in hardware, in firmware, in a software module executed by the processing module 524, or in any practical combination thereof. The memory 526 generally represents any non-transitory short or long term storage media or other computer-readable medium capable of storing programming instructions for execution by the processing module 524, including any sort of random access memory (RAM), read only memory (ROM), flash memory, registers, hard disks, removable disks, magnetic or optical mass storage, and/or the like. The computer-executable programming instructions, when read and executed by the processing module 524, cause the processing module 524 to perform certain tasks, operations, functions, and processes described in more detail below. In exemplary embodiments, the memory 526 also stores or otherwise maintains metrology reference information for use in determining hybrid recipes to be implemented by the hybrid measurement system 506. In this regard, the metrology reference information may include data and/or information pertaining to various material properties (e.g., the physical, chemical, and/or optical properties of the materials on the wafer 510), data and/or information pertaining to the performance characteristics of the available metrology tools 512, 514 (e.g., calibration curves or other legacy information, uncertainty data, and the like), data and/or information pertaining to the physical features, dimensions, structures, and the like which are to be fabricated on the wafer 510 by the processing tools 502, 504, and the like.

It should be understood that FIG. 5 is a simplified representation of the fabrication system 500 for purposes of explanation and ease of description, and FIG. 5 is not intended to limit the subject matter in any way. In this regard, practical embodiments of the hybrid measurement system 506 may include any number of metrology tools configured to iteratively exchange measurements any number of times to achieve final hybrid measurements having a desired level of accuracy and/or reliability. Additionally, although FIG. 5 depicts the computing device 516 and metrology tools 512, 514 as being separate hardware elements, in practice, the features and/or functionality of the computing device 516 may be implemented by or otherwise integrated with a metrology tool, such as, for example, the primary metrology tool 514. Furthermore, a practical embodiment of the fabrication system 500 may include any number of processing tools 502, 504 and/or multiple instances of the hybrid measurement system 506 configured to fabricate and measure any number of physical features, dimensions and/or other attributes of structures formed on a wafer 510 and achieve a final semiconductor device structure with the desired feature dimensions and performance characteristics.

As described above in the context of FIG. 2, in exemplary embodiments, a metrology tool 512, 514 in the hybrid measurement system 506 of FIG. 5 includes at least a communications arrangement (e.g., communications arrangement 202), a measurement arrangement (e.g., measurement arrangement 204), a processing module (e.g., processing module 206), and a data storage element (e.g., memory 208). In exemplary embodiments, the memory of a respective metrology tool 512, 514 stores or otherwise maintains a measurement recipe for that respective metrology tool 512, 514 that consists of a sequence of instructions or commands which are executed by the processing module and dictate the manner in which the processing module operates the measurement arrangement to measure the wafer and obtain raw feature measurement data, along with measurement algorithms (or functions) used by the processing module to calculate or otherwise determine feature measurements based on the raw feature measurement data obtained via the measurement arrangement. As described in greater detail below, in exemplary embodiments, the measurement recipe and measurement algorithms maintained in the memory are capable of being modified to implement a hybrid recipe as part of a hybrid measurement system, such that the modified measurement recipe for the respective metrology tool 512, 514 includes instructions or commands which are executed by the processing module and dictate the manner in which the processing module communicates feature measurements to/from other metrology tools along with modified algorithms or functions used by the processing module to calculate or otherwise determine hybrid feature measurements based on the raw feature measurement data obtained via the measurement arrangement and other feature measurements obtained from other metrology tools in the hybrid measurement system 506.

Figure 6:
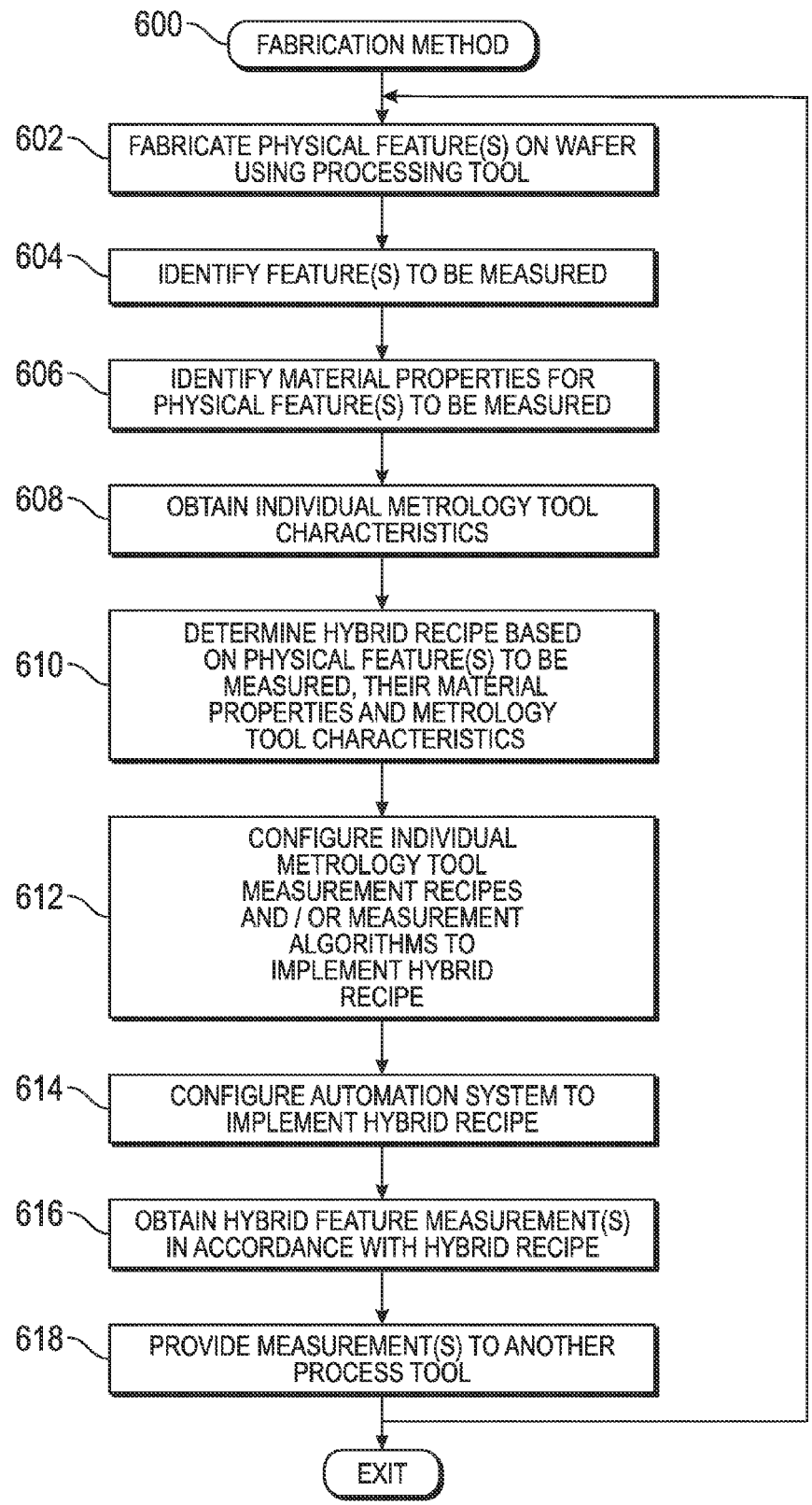
FIG. 6 is a flow diagram of an exemplary fabrication method suitable for use with the fabrication system of FIG. 5 in an exemplary embodiment.

FIG. 6 depicts an exemplary fabrication method 600 suitable for implementation by a fabrication system 500 to obtain hybrid measurements of features of semiconductor devices in an automated manner. The various tasks performed in connection with the fabrication method 600 may be performed by software, hardware, firmware, or any combination thereof. For illustrative purposes, the following description refers to elements mentioned above in connection with FIG. 5. In practice, portions of the fabrication method 600 may be performed by different elements of the fabrication system 500, such as, for example, the processing tools 502, 504, the hybrid measurement system 506, the fabrication automation system 508, the primary metrology tool 514, the secondary metrology tool(s) 512, and/or the host computing device 516. It should be appreciated that the fabrication method 600 may include any number of additional or alternative tasks, the tasks need not be performed in the illustrated order and/or the tasks may be performed concurrently, and/or the fabrication method 600 may be incorporated into a more comprehensive procedure or process having additional functionality not described in detail herein. Moreover, one or more of the tasks shown and described in the context of FIG. 6 could be omitted from a practical embodiment of the fabrication method 600 as long as the intended overall functionality remains intact.

Referring to FIG. 6, and with continued reference to FIG. 5, in an exemplary embodiment, the fabrication method 600 begins by fabricating one or more physical features and/or other semiconductor device structures on a wafer using one or more processing tools (task 602). In this regard, the fabrication automation system 508 automatically transfers the wafer 510 through one or more processing tools 502 in an appropriate manner to create physical features and/or structures on the wafer 510 having dimensions chosen to result in semiconductor devices on the wafer 510 having particular performance characteristics. After the physical features and/or structures are fabricated on the wafer using the one or more processing tools, the fabrication method 600 continues by providing the wafer to the hybrid measurement system for determining a hybrid recipe and obtaining hybrid measurements of the physical features and/or structures fabricated on the wafer in accordance with the hybrid recipe. After the processing tool 502 preceding the hybrid measurement system 506 completes a fabrication process step, the fabrication automation system 508 automatically transfers the wafer 510 from a processing tool 502 to the hybrid measurement system 506, as described in greater detail below.

Still referring to FIG. 6, in an exemplary embodiment, to determine the hybrid recipe, the fabrication method 600 identifies the physical characteristics of the feature(s) of the wafer to be measured and the material properties of the features on the wafer (tasks 604, 606). The fabrication method 600 also obtains or otherwise identifies the performance characteristics of the metrology tools of the hybrid measurement system, and determines the hybrid recipe based on the physical characteristics of the features to be measured, the material properties of those features and/or other features on the wafer, and the metrology tool performance characteristics (tasks 606, 608). In this regard, based on the physical characteristics of the features being measured and their material properties along with the individual metrology tool characteristics, the fabrication method 600 determines or otherwise identifies, as the primary metrology tool, the metrology tool of the hybrid measurement system 506 that is capable of measuring a particular feature with the highest accuracy (or lowest uncertainty) relative to the other available metrology tools. The fabrication method 600 also determines which feature measurements obtained using the other available metrology tools may be utilized to augment or otherwise improve the feature measurement of the primary metrology tool to obtain the hybrid feature measurement. In this regard, the other metrology tools function as the secondary metrology tool(s) 512 which provide measurements that are utilized by the primary metrology tool 514 to determine a hybrid measurement for a particular feature by augmenting its feature measurement using the measurements obtained from the secondary metrology tool(s) 512. The hybrid recipe determined by the fabrication method 600 includes a measurement sequence (or sampling plan) defining the order in which the metrology tool(s) 512, 514 measure the wafer 510 and which feature(s) of the wafer 510 each respective metrology tool 512, 514 should measure. The hybrid recipe also identifies which measurements obtained by one metrology tool 512, 514 are to be provided to the other metrology tools 512, 514 and the measurement algorithms and/or functions to be implemented by a metrology tool 512, 514 to augment its feature measurements using feature measurements provided by another metrology tool 512 to determine hybrid feature measurements.

After the hybrid recipe is determined, the fabrication method 600 configures the individual metrology tools of the hybrid measurement system to implement the hybrid recipe by modifying the measurement recipes and/or measurement algorithms of the individual metrology tools (task 612). For example, for each secondary metrology tool 512 utilized by the hybrid recipe, the computing device 516 modifies the respective measurement recipe maintained by the respective secondary metrology tool 512 so that the respective metrology tool 512 operates its measurement arrangement to obtain the feature measurements utilized for determining a hybrid measurement (e.g., by the primary metrology tool 514 or another secondary metrology tool 512). Additionally, the computing device 516 modifies the respective measurement recipe maintained by the respective secondary metrology tool 512 so that the respective metrology tool 512 communicates its feature measurements to the computing device 516, the primary metrology tool 514 and/or another secondary metrology tool 512. The computing device 516 also modifies the respective measurement recipe maintained by the primary metrology tool 514 so that it operates its measurement arrangement to measure the identified features of interest on the wafer 510 and obtains the secondary metrology tool feature measurements obtained directly from one or more of the secondary metrology tools 512 or from the computing device 516. Additionally, the computing device 516 modifies the measurement algorithms implemented by the primary metrology tool 514 so that the primary metrology tool determines hybrid measurements for the features of interest on the wafer 510 based on the raw measurement data obtained via its measurement arrangement 204 and the secondary metrology tool feature measurements.

For example, referring to FIG. 5 and with continued reference to FIG. 6, in an exemplary embodiment, the computing device 516 and/or the hybrid measurement system 506 receives or otherwise obtains, from one or more of the preceding processing tools 502 and/or the fabrication automation system 508, information pertaining to the fabrication processes performed by the preceding processing tools 502, and based on that fabrication process information, identifies the physical characteristics of features fabricated on the wafer 510. Based on that information, the computing device 516 and/or the hybrid measurement system 506 is capable of automatically (i.e., without or otherwise independent of any manual input or other manual intervention) identifying or otherwise determining, in real-time, which physical feature(s) on the wafer 510 are to be measured. For example, the computing device 516 may identify that the preceding processing tools 502 fabricated a gate structure on the wafer 510 and that the amount of undercut of a gate dielectric material should be measured. The computing device 516 utilizes the information obtained from the preceding processing tools 502 and/or the metrology reference information maintained in memory 526 to identify the material properties for the various layers of the gate structure as well as neighboring regions of material on the wafer 510. The computing device 516 also utilizes the metrology reference information maintained in memory 526 to identify or otherwise determine performance characteristics for the individual metrology tools 512, 514 of the hybrid measurement system 506.

In one exemplary embodiment, based on the identified feature to be measured (e.g., the gate dielectric undercut), the physical characteristics and/or material properties of that feature, and the metrology tool characteristics, the computing device 516 may identify that an optical critical dimension (OCD) tool should function as the primary metrology tool 514 that determines a hybrid measurement for the gate dielectric undercut and that an atomic force microscopy (AFM) tool and a critical dimension scanning electron microsopy (CDSEM) tool should function as secondary metrology tools 512 that measure other features of the wafer 510. For example, the computing device 516 may determine that the AFM tool should obtain measurements of the gate sidewall angle, that the CDSEM tool should obtain measurements of the gate critical dimension (e.g., the gate width), that the gate sidewall angle measurements from the AFM tool should be provided to the CDSEM tool for augmenting the gate critical dimension measurement, and that the gate sidewall angle measurements and the gate critical dimension measurements should be provided to the OCD tool for determining the hybrid gate dielectric undercut measurement. In this regard, the hybrid recipe determined by the computing device 516 includes a sampling plan indicating a measurement sequence that begins with the wafer 510 being measured by the AFM tool first, then the CDSEM tool, followed by the OCD tool.

Continuing the above example, to implement the hybrid recipe, the computing device 516 modifies the recipe of the AFM tool so that the AFM tool measures the sidewall angle of the gate structure fabricated on the wafer 510 and provides the gate sidewall angle measurement to the CDSEM tool, the OCD tool, and/or the computing device 516. Similarly, the computing device 516 modifies the recipe of the CDSEM tool so that the CDSEM tool measures the critical dimension of the gate structure fabricated on the wafer 510 and modifies the algorithms utilized by the CDSEM tool to determine a hybrid gate critical dimension based on the raw feature measurement data obtained via its measurement arrangement 204 and the gate sidewall angle measurement from the AFM tool provided to the CDSEM tool by the AFM tool and/or the computing device 516. In this regard, the algorithm used by the CDSEM tool when calculating the gate critical dimension may be modified using the gate sidewall angle measurement from the AFM tool. For example, one or more algorithm parameters or settings (e.g., a grayscale threshold or the like) may be modified (e.g., increased and/or decreased) based on the gate sidewall angle measurement from the AFM tool. The computing device 516 also modifies the recipe of the CDSEM tool so that the CDSEM tool provides the hybrid gate critical dimension measurement to the OCD tool and/or the computing device 516.

In an exemplary embodiment, the computing device 516 also modifies the recipe of the OCD tool so that the OCD tool measures the gate dielectric undercut of the gate structure fabricated on the wafer 510. In accordance with one or more embodiments, the computing device 516 modifies the algorithms utilized by the OCD tool to determine a hybrid gate dielectric undercut based on the raw feature measurement data obtained via its measurement arrangement 204, the gate sidewall angle measurement from the AFM tool provided by the AFM tool and/or the computing device 516, and the hybrid gate critical dimension measurement from the CDSEM tool provided by the CDSEM tool and/or the computing device 516. For example, the OCD tool may determine the hybrid gate dielectric undercut measurement as a function of the gate dielectric undercut measured by its measurement arrangement (e.g., the raw gate dielectric undercut measurement), the hybrid gate critical dimension measurement, and the gate sidewall angle measurement, wherein the raw gate dielectric undercut measurement, the hybrid gate critical dimension measurement, and the gate sidewall angle measurement are weighted in accordance with their relative accuracy and/or reliability (e.g., using a quality weighting factor based on or influenced by the total measurement uncertainty (TMU) and/or reference measurement system uncertainty (RMSU) of the respective metrology tool 512, 514). In this regard, the gate sidewall angle measurement from the AFM tool and/or the hybrid gate critical dimension measurement from the CSDEM tool may be utilized to reduce the number of floating parameters in the algorithm used by the OCD tool when calculating the gate dielectric undercut. The computing device 516 also modifies the recipe of the OCD tool to provide the hybrid gate dielectric undercut measurement to the computing device 516 for subsequent provision to one or more subsequent processing tools 504. In other embodiments, the computing device 516 may modify the recipe of the OCD tool to provide the raw gate dielectric undercut measurement to the computing device 516, wherein the computing device 516 determines the hybrid gate dielectric undercut measurement based on the raw gate dielectric undercut measurement received from the OCD tool, the hybrid gate critical dimension measurement received from the CDSEM tool, and the gate sidewall angle measurement received from the AFM tool.

Referring again to FIG. 6 and with continued reference to FIG. 5, after configuring the metrology tools to implement the hybrid recipe, the fabrication method 600 continues by configuring the fabrication automation system to automatically transfer the wafer through the individual metrology tools in accordance with the measurement sequence (or sampling plan) defined by the hybrid recipe (task 614). In this regard, the computing device 516 and/or the hybrid measurement system 506 also provides commands or instructions to the fabrication automation system 508 that configure the fabrication automation system 508 to automatically transfer the wafer 510 from the preceding processing tool 502 through the metrology tools 512, 514 in the order defined by sampling plan for the hybrid recipe. For example, the computing device 516 may signal, command, or otherwise instruct the fabrication automation system 508 to sequentially transfer the wafer 510 from the preceding processing tool 502 to a first secondary metrology tool 512 (e.g., the AFM tool), from the first secondary metrology tool 512 to a second secondary metrology tool 512 after first secondary metrology tool 512 finishes executing its measurement recipe (e.g., from the AFM tool to the CDSEM tool after the AFM tool obtains the gate sidewall angle measurement), and then from the second secondary metrology tool 512 to the primary metrology tool 514 after second secondary metrology tool 512 finishes executing its measurement recipe (e.g., from the CDSEM tool to the OCD tool after the CDSEM tool obtains the gate critical dimension measurement).

After the fabrication method 600 configures the metrology tools and the fabrication automation system to implement the hybrid recipe, the fabrication method 600 continues by obtaining hybrid feature measurement(s) in accordance with the hybrid recipe and providing the hybrid feature measurement(s) to one or more succeeding processing tools (tasks 616, 618). In this regard, after the wafer 510 is processed by the processing tool 502 preceding the hybrid measurement system 506, the fabrication automation system 508 automatically transfers the wafer 510 from the preceding processing tool 502 to the first secondary metrology tool 512 (e.g., the AFM tool) of the sampling plan measurement sequence. The first secondary metrology tool 512 (e.g., the AFM tool) implements a portion of the hybrid recipe by executing its modified measurement recipe to obtain a measurement of a feature or attribute of the wafer 510 (e.g., the gate sidewall angle measurement) and provide that feature measurement to another metrology tool 512, 514 and/or the computing device 516. After first secondary metrology tool 512 finishes executing its measurement recipe, the fabrication automation system 508 transfers the wafer 510 from the first secondary metrology tool 512 to the second secondary metrology tool 512 (e.g., the CDSEM tool), which implements another portion of the hybrid recipe by executing its modified measurement recipe to obtain a measurement of another feature or attribute of the wafer 510 (e.g., the gate critical dimension measurement) and provide that feature measurement to the primary metrology tool 514 and/or the computing device 516. After second secondary metrology tool 512 finishes executing its measurement recipe, the fabrication automation system 508 transfers the wafer 510 from the second secondary metrology tool 512 to the primary metrology tool 514 (e.g., the OCD tool), which implements another portion of the hybrid recipe by executing its modified measurement recipe to obtain a measurement of another feature or attribute of the wafer 510 (e.g., the gate dielectric undercut measurement). As described above, the primary metrology tool 514 and/or the computing device 516 utilizes the feature measurements obtained from the secondary metrology tools 512 to augment the feature measurement obtained by the primary metrology tool 514 to determine a hybrid feature measurement.

In accordance with one or more embodiments, the computing device 516 provides the hybrid feature measurement to one or more of the processing tools 502, 504 and/or the fabrication automation system 508 for modifying subsequent process steps based on the hybrid feature measurement. In this regard, if the fabrication system 500 and/or the fabrication automation system 508 supports advanced process control (APC) or another automated process management feature, the hybrid feature measurement may be utilized to modify the recipes of preceding processing tools 502 for future wafers and/or subsequent processing tools 504 for the current wafer 510. For example, the fabrication recipe executed by a subsequent processing tool 504 may be adjusted to correct any deviations between the hybrid feature measurement and an intended feature measurement that exceed a threshold amount, or the fabrication automation system 508 may transfer the wafer 510 in a manner that bypasses one or more subsequent processing tools 504 when the hybrid feature measurement is substantially equal to the intended feature measurement (e.g., within a threshold amount of the intended feature measurement). In other embodiments, the fabrication recipe executed by one or more preceding processing tools 502 may be adjusted to correct any deviations between the hybrid feature measurement and an intended feature measurement, thereby increasing the likelihood that subsequent wafers achieve the intended feature measurements without the need for any corrective action.

Still referring to FIG. 6, in practice, the fabrication method 600 repeats throughout operation of the fabrication system 500 to fabricate semiconductor device structures on additional wafers. In this regard, for each iteration of the fabrication method 600, the hybrid recipe determined by the hybrid measurement system 506 and/or the computing device 516 may vary depending on hybrid feature measurements determined for previous wafers. For example, the hybrid measurement system 506 and/or the computing device 516 may analyze or otherwise determine uncertainty and/or accuracy metrics for hybrid feature measurements determined by the hybrid measurement system 506 and adjust the hybrid recipe for subsequent wafers in a manner that is intended to improve the accuracy and/or reduce the uncertainty of the hybrid feature measurements. In this manner, the hybrid recipes implemented by the hybrid measurement system 506 may vary dynamically over time.

With the fabrication method 600, accurate and/or reliable hybrid measurements for physical features and/or dimensions on a wafer are determined using measurements from different metrology tools in an automated manner. A hybrid recipe may be determined substantially in real-time and the metrology tools and fabrication automation system may be automatically configured to implement the hybrid recipe, thereby allowing the hybrid measurement system to be seamlessly integrated between processing steps and dynamically vary the hybrid measurements determined by the hybrid measurement system based on the features fabricated on the wafer. As a result, highly accurate measurements can be obtained in a reduced amount of time and in a non-destructive manner by combining independent measurements from different metrology tools, as described above, thereby allowing a foundry or other fabrication entity to achieve a higher yield.

Process-Enhanced Metrology

As described in greater detail below in the context of FIGS. 7-8, in exemplary embodiments, process-enhanced hybrid measurements are calculated or otherwise determined using measurements obtained from one or more metrology tools in a manner that is influenced by process information obtained from the one or more processing tools, process control systems, factory control systems, or the like that quantifies or otherwise describes the fabrication processes the semiconductor device structure and/or wafer were subject to that is obtained from one or more processing tools, process control systems, factory control systems, or the like. The process information may be utilized to modify or otherwise adjust the weighting factors associated with feature measurements from multiple metrology tools to achieve an adjusted feature measurement that accounts for the actual processing of the semiconductor device structure and/or wafer. Alternatively, the process information may be appropriately weighted and combined with the feature measurements from multiple metrology tools to achieve an adjusted feature measurement. In other words, in exemplary embodiments, a process-enhanced hybrid measurement for a particular feature of interest is determined as a function of a measurement of that feature from a first metrology tool, one or more feature measurements (either of the feature of interest or another feature of the semiconductor device structure) obtained using one or more additional metrology tools (which may precede or succeed the first metrology tool in a measurement sequence), and process information that quantifies or otherwise describes the processing of the wafer having the particular feature of interest formed thereon by one or more processing tools, wherein each of the feature measurements and each of the different pieces of the process information are weighted or factored in a manner that corresponds to their accuracy, reliability and/or correlation with the actual dimensions of the feature of interest. Additionally, in some embodiments, the measurement configuration information (e.g., the measurement recipes or one or more of the measurement parameters or settings defined by a respective measurement recipe) for the respective metrology tools may also be utilized to determine the process-enhanced hybrid feature measurement. That is, a process-enhanced hybrid measurement may be determined using a function of a measurement of a feature from a primary metrology tool, one or more feature measurements from one or more secondary metrology tools, metrology configuration information for the primary metrology tool and/or one or more of the secondary metrology tool(s), and process information corresponding to processing by preceding processing tools.

It should be noted that the equation or function used to calculate the process-enhanced hybrid feature measurement may vary depending on the particular feature of interest being measured, the types of metrology tools that are available and/or utilized in the measurement sequence, the ordering of the metrology tools in the measurement sequence, the types of processing tools that are utilized in the fabrication semiconductor device structure and/or wafer having the feature of interest, and the ordering in which the semiconductor device structure and/or wafer is fabricated by those processing tools, and the desired level of accuracy and/or reliability for the final adjusted feature measurement. Thus, the subject matter described herein is not necessarily limited to any particular manner of combining feature measurements from different metrology tools and process information to achieve adjusted (i.e., process-enhanced) hybrid feature measurements.

In a similar manner as described above in the context of FIG. 4, for a particular feature of interest, weighting factors for different pieces of the process information are determined based on correlation of that respective piece of process information with the actual dimensions of the feature of interest. Thus, a model for a dimension of a feature as a function of different pieces of process information may be determined, with the weighting factors for a respective piece of process information being determined based on the correlation metric for that respective piece of process information with respect to the dimension of the feature. By using the correlation between process information and the feature dimensions in combination with the feature measurements from the metrology tools, process-enhanced hybrid feature measurement may be achieved with a desired level of accuracy and/or reliability while performing fewer measurements, thereby reducing metrology costs.

Figure 7:
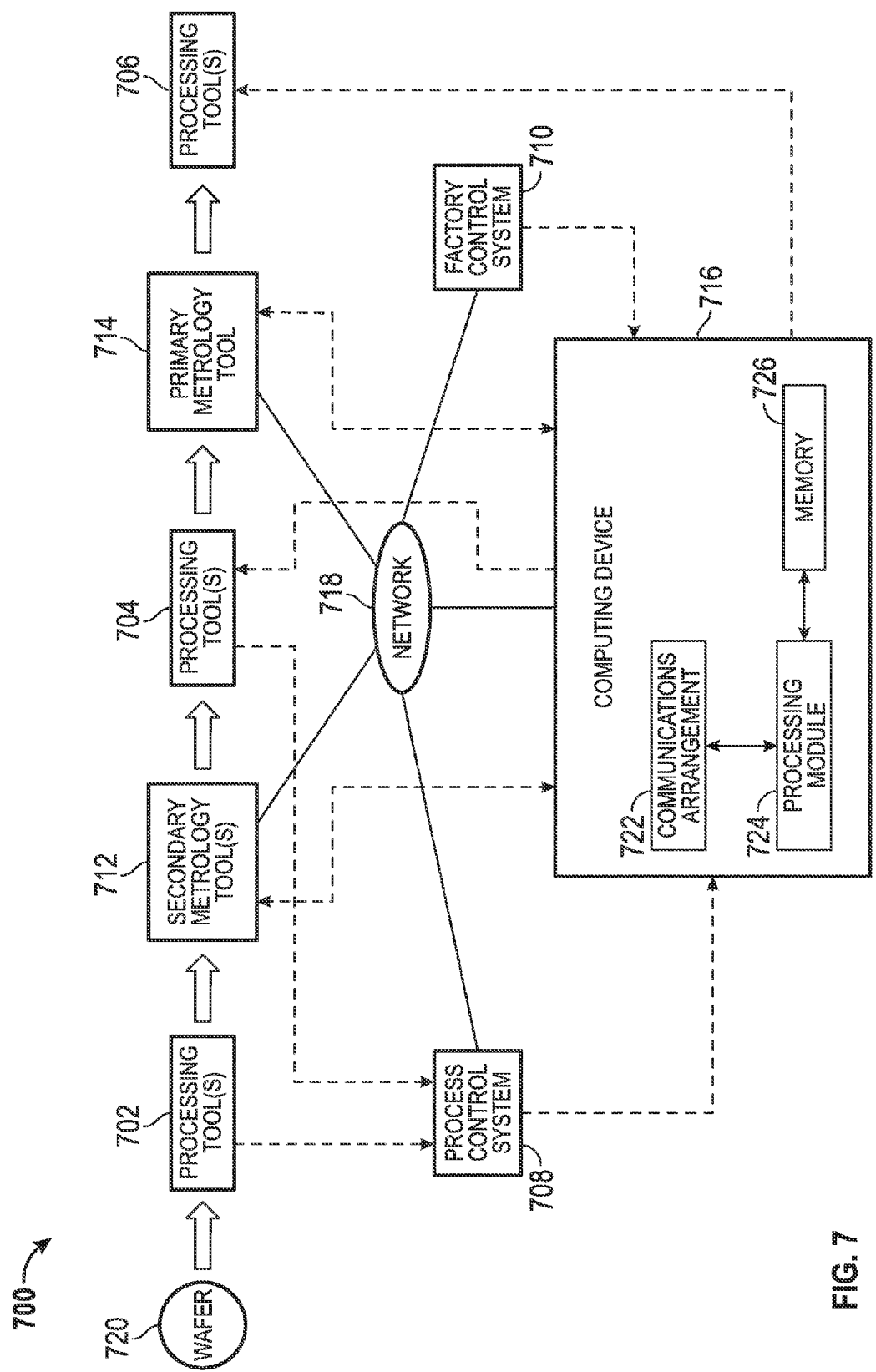
FIG. 7 is a block diagram of a fabrication system in an exemplary embodiment.

Referring to FIG. 7, in exemplary embodiments, a fabrication system 700 capable of obtaining process-enhanced hybrid measurements includes, without limitation, a plurality of processing tools 702, 704, 706, a process control system 708, a factory control system 710, a plurality of metrology tools 712, 714, and a host computing device 716. In the illustrated embodiment, the host computing device 716 is communicatively coupled to the process control system 708, the factory control system 710, and the metrology tools 712, 714 over a communications network 718. As described above, the metrology tools 712, 714 include measurement hardware capable of measuring physical features, dimensions and/or other attributes of one or more semiconductor device structures formed on a substrate (or wafer) 720 of semiconductor material by subjecting the wafer 720 to fabrication processes performed by one or more processing tools 702, 704 that precede that respective metrology tool 712, 714.

It should be understood that FIG. 7 is a simplified representation of the fabrication system 700 for purposes of explanation and ease of description, and FIG. 7 is not intended to limit the subject matter in any way. In this regard, practical embodiments of the fabrication system 700 may include any number of metrology tools and/or processing tools configured to fabricate and measure any number of physical features, dimensions and/or other attributes of semiconductor device structures formed on a wafer 720 and achieve a final semiconductor device structure with the desired feature dimensions and performance characteristics. Additionally, although FIG. 7 depicts the computing device 716 as a separate hardware element, in practice, some or all of the features and/or functionality of the computing device 716 may be implemented by or otherwise integrated with a metrology tool (e.g., metrology tool 714), the process control system 708 and/or the factory control system 710.

In exemplary embodiments, the host computing device 716 calculates or otherwise determines process-enhanced measurements of one or more physical features, dimensions and/ or attributes of the wafer 720 using measurements obtained by a respective metrology tool in conjunction with process information pertaining to the fabrication of those semiconductor device features on the wafer 720 by one or more processing tools. Furthermore, the host computing device 716 may calculate or otherwise determine process-enhanced hybrid measurements by utilizing the measurements obtained by a respective metrology tool (e.g., metrology tool 712) in combination with process information pertaining to processing of the wafer 720 by preceding and/or subsequent processing tools (e.g., processing tools 702, 704) to augment or otherwise adjust measurements obtained by a subsequent metrology tool (e.g., metrology tool 714). In this regard, a process-enhanced hybrid measurement is calculated or otherwise determined based on different measurements from different metrology tools 712, 714 in a manner that is influenced by process information pertaining to fabrication of one or more semiconductor device structures on the wafer 720 by the one or more of the processing tools 702, 704 that precede those respective metrology tools 712, 714. As a result, a composite measurement for a particular physical feature and/or critical dimension of the device structure(s) on the wafer 720 may be achieved that is more accurate and/or reliable than an individual measurement for that feature and/or dimension that would be obtained from an individual metrology tool 712, 714. As described above in the context of FIGS. 5-6, in accordance with one or more embodiments, the process-enhanced hybrid measurement(s) determined by the host computing device 716 may be provided to or otherwise utilized by one or more subsequent processing tool(s) 706 to influence the manner in which the subsequent processing tool(s) 706 fabricate additional physical features, dimensions and/or other attributes on the wafer 720. Additionally, in some embodiments, the process-enhanced hybrid measurement(s) determined by the host computing device 716 may also be provided to and/or utilized by one or more preceding processing tool(s) 702, 704 to influence fabrication of subsequent wafers.

In the illustrated embodiment of FIG. 7, the process control system 708 generally represents the components of the fabrication system 700 that are coupled to the processing tools 702, 704, 706 to obtain, from a respective processing tool, data or other information quantifying a condition or characteristic of that respective processing tool during processing of the wafer 720 by that respective processing tool to fabricate one or more features on the wafer 720. For example, process control system 708 may obtain, from a respective processing tool 702, 704, 706, sensor data obtained from one or more sensors of a respective processing tool 702, 704, 706 that are used to continuously monitor the health of that respective processing tool 702, 704, 706 during processing. In this regard, the sensor data includes values for a particular condition or characteristic of the processing tool 702, 704, 706 that were measured, detected, or otherwise sensed during processing of the wafer 720 (e.g., in real-time) by that respective processing tool 702, 704, 706, such as, for example, a temperature inside a chamber of the respective processing tool, a temperature ramp, a pressure inside a chamber of the respective processing tool, an exhaust pressure, a flow rate of a reactant introduced into the chamber of the respective processing tool, a relative position for an inlet and/or outlet valve to/from the chamber of the respective processing tool, a voltage (e.g., a deposition voltage, an etch voltage, or the like), and the like. Depending on the embodiment, the sensor data may be realized as instantaneous values that were sensed or otherwise measured contemporaneously to the wafer 720 being processed or an average of values that were sensed or otherwise measured over a longer time interval during the processing of the wafer 720. In this manner, the sensor data obtained by the process control system 708 from a respective processing tool 702, 704, 706 quantifies or otherwise describes the fabrication processes that the wafer 720 was actually subjected to.

Additionally, the process control system 708 may obtain qualification data indicative of the health of the processing tool 702, 704, 706 prior to processing the wafer 720. In this regard, the qualification data includes measurements obtained by one or more sensors of the processing tool 702, 704, 706 for one or more dummy or test wafers, also referred to as monitor wafers, wherein the qualification data is indicative of the relative health of the processing tool 702, 704, 706. For example, the qualification data may correspond to data obtained from test wafers having known dimensions and/or characteristics by the fabrication automation system on a periodic basis (e.g., daily or some other frequency) as part of routine monitoring and/or qualification of the processing tools 702, 704, 706. The qualification data may include measurements of the wafer thickness, the wafer thickness uniformity, the optical constant for the semiconductor material of the wafer, or the like, which indicate the relative health of the processing tool 702, 704, 706 when compared to known reference values for the particular test wafer. In this manner, the qualification data that was most recently obtained by the process control system 708 from or for a respective processing tool 702, 704, 706 quantifies or otherwise describes the condition or health of that respective processing tool 702, 704, 706 that the wafer 720 was processed by when the wafer 720 was processed by that respective processing tool 702, 704, 706.

In accordance with one or more embodiments, the process control system 708 also determines fault detection control data that estimates, predicts or otherwise quantifies an expected (or predicted) condition of a respective processing tool 702, 704, 706 during processing of the wafer 720 by that respective processing tool 702, 704, 706. For example, the process control system 708 may calculate fault detection control data for a respective processing tool based on sensor data obtained from that respective processing tool and equations, formulas, or other specifications for various equipment constants for that respective processing tool.

Still referring to FIG. 7, the factory control system 710 generally represents the components of the fabrication system 700 configured to store or otherwise maintain contextual process information for the wafer 720 that quantifies or otherwise describes the state of the semiconductor device structure being measured and/or the wafer 720 within the fabrication system 700 as the wafer 720 is being processed. For example, the context information maintained by the factory control system 710 may quantify the relative location on the wafer 720 of the semiconductor device structure being measured, an identification of the respective processing tool used to fabricate features of the semiconductor device structure on the wafer 720, a relative position (e.g., location and/or orientation) of the wafer 720 and/or the semiconductor device structure being measured within the respective processing tool during processing by that tool (e.g., an identification of the chamber of the processing tool where the wafer 720 was processed), a relative position (e.g., location and/or orientation) of the wafer 720 and/or the semiconductor device structure being measured within a front opening unified pod (FOUP), a duration for which the wafer was processed by the respective processing tool, the type of reactants and/or other materials used by a respective processing tool during processing of the wafer 720 (e.g., a type of photoresist material used, a type of slurry material used, or the like), process models, variation signatures indicative of the stability of the chamber environment for a processing tool (e.g., across-wafer radial signatures, across-lot signatures for wafers in the same FOUP, and the like) and the like.

As described in greater detail below, in exemplary embodiments, the computing device 716 is communicatively coupled to the process control system 708 and the factory control system 710 to obtain process information (e.g., sensor data, fault detection control data, contextual processing information) pertaining to the fabrication of the semiconductor device structure(s) on the wafer 720 and utilize the process information obtained from the process control system 708 and/or the factory control system 710 to augment or otherwise adjust feature measurements obtained by one or more of the metrology tools 712, 714 to obtain process-enhanced hybrid measurements of one or more features of the semiconductor device structure fabricated on the wafer 720. As described above in the context of FIGS. 5-6, the computing device 716 may also obtain information pertaining to the physical features, structures and/or dimensions fabricated on the wafer 720 by the respective processing tools, identify physical characteristics and/or material properties of the feature(s) on the wafer 720 to be measured, determine a process-enhanced recipe for measuring the identified feature(s) on the wafer 720, and communicate with the respective metrology tool 712, 714 to modify the measurement recipe maintained by that respective metrology tool 712, 714. For purposes of explanation, in the context of FIGS. 7-8, the metrology tool 714 which measures the wafer 720 last in the measurement sequence defined by the process-enhanced recipe may be alternatively referred to as the primary metrology tool, while the preceding metrology tool(s) 712 may be alternatively referred to as the secondary metrology tool(s) 712. As described above, to implement the process-enhanced recipe, the computing device 716 may signal, command, or otherwise instruct the factory control system 710 (or another fabrication automation system) to transfer the wafer 720 from a preceding processing tool 702 to the appropriate secondary metrology tool(s) 712 in the order specified by the measurement sequence of the process-enhanced recipe, prior to transferring the wafer 720 subsequent processing tools 704,706 and/or subsequent metrology tool(s) 714.

As described above in the context of FIG. 2, in exemplary embodiments, each metrology tool 712, 714 includes at least a communications arrangement (e.g., communications arrangement 202), a measurement arrangement (e.g., measurement arrangement 204), a processing module (e.g., processing module 206), and a data storage element (e.g., memory 208) that stores or otherwise maintains a measurement recipe and/or measurement algorithms for that respective metrology tool 712, 714, which may be modified to implement a process-enhanced measurement recipe. The modified process-enhanced measurement recipe for a respective metrology tool 712, 714 may include instructions or commands which are executed by the processing module and dictate the manner in which the processing module communicates feature measurements to/from the host computing device 716 and/or other metrology tools along with modified algorithms or functions used by the processing module to calculate or otherwise determine process-enhanced feature measurements based on the raw feature measurement data obtained via the measurement arrangement, process information pertaining to processing of the wafer 720 by preceding processing tools 702, 704 and/or other feature measurements obtained from other metrology tools (i.e., for process-enhanced hybrid measurements).

As described above in the context of FIG. 5, in exemplary embodiments, the host computing device 716 includes at least a communications arrangement 722, a processing module 724, and a data storage element (or memory) 726. The memory 726 generally represents any non-transitory short or long term storage media or other computer-readable medium capable of storing programming instructions for execution by the processing module 724 that, when read and executed by the processing module 724, cause the processing module 724 to perform certain tasks, operations, functions, and processes to modify the measurement recipes and/or measurement algorithms of the metrology tools 712, 714 and support the process-enhanced measurement method 800 described in more detail below in the context of FIG. 8. In some embodiments, in addition to utilizing process information when determining the process-enhanced hybrid measurements, the host computing device 716 may also utilize the measurement parameters or settings defined by the measurement recipes for the individual metrology tools 712, 714 to further influence, augment, or otherwise adjust measurements obtained by the metrology tools 712, 714 to obtain process-enhanced hybrid feature measurements. For example, the measurement parameters or settings for a particular metrology tool (e.g., the angle of incidence for the reference signal generated by the metrology tool, the angle of the sensors, detectors, optics, and/or other hardware of the metrology tool used to measure the response signal from the wafer, the resolution of the metrology tool, the intensity and/or frequency settings for the reference signal, the type of algorithm used by the metrology tool to calculate feature measurements and/or various algorithm parameters, and the like) may be utilized to modify or otherwise adjust the weighting factor associated with feature measurements from that metrology tool.

In the illustrated embodiment of FIG. 7, to implement a process-enhanced recipe, the computing device 716 signals, commands, or otherwise instructs the factory control system 710 (or another fabrication automation system) to transfer the wafer 720 to one or more initial processing tools 702. After the processing tool(s) 702 processes the wafer 720 to fabricate one or more features of a semiconductor device structure on the wafer 720, the computing device 716 signals, commands, or otherwise instructs the fabrication automation system to transfer the wafer 720 to the secondary metrology tool(s) 712. The computing device 716 also obtains, via the network 718, process information quantifying or otherwise describing the processing of the wafer 720 by the processing tool(s) 702 during fabrication of the feature(s) of the semiconductor device structure from the process control system 708 and/or the factory control system 710. For example, the computing device 716 may obtain, from the process control system 708, sensor data measured by one or more sensors of the processing tool(s) 702 during processing of the wafer 720 and/or fault detection control data from the processing tool(s) 702. Additionally or alternatively, the computing device 716 may also obtain, from the factory control system 710, context information that describes or otherwise quantifies the state of the semiconductor device structure and/or wafer 720 during processing by the processing tool(s) 702. In accordance with one or more embodiments, the computing device 716 obtains raw measurement data from the secondary metrology tool(s) 712 and determines a process-enhanced measurement for one or more physical feature(s) on the wafer 720 based on the raw measurement data and the process information obtained from the process control system 708 and/or the factory control system 710 that quantifies or otherwise describes the preceding processing by the processing tool(s) 702. The computing device 716 may also store (e.g., in memory 726) the raw measurement data from the secondary metrology tool(s) 712 and the process information that quantifies or otherwise describes the preceding processing by the processing tool(s) 704 for use in determining additional process-enhanced hybrid feature measurements. In alternative embodiments, the computing device 716 modifies the measurement recipe implemented by the secondary metrology tool 712 in a manner that is influenced by the process information obtained from the process control system 708 and/or the factory control system 710, such that the secondary metrology tool 712 determines a process-enhanced measurement for one or more physical feature(s) on the wafer 720 based on the raw measurement data obtained by the secondary metrology tool(s)

712 and the process information quantifying or otherwise describing the preceding processing by the processing tool(s) 702.

After process-enhanced feature measurements are obtained using raw measurement data from the secondary metrology tool(s) 712 and process information pertaining to the processing by the preceding processing tool(s) 702, a fabrication automation system may be signaled, commanded, or otherwise instructed to transfer the wafer 720 to one or more subsequent processing tool(s). Additionally, as described above in the context of FIGS. 5-6, the computing device 716 may signal, command, or otherwise instruct the processing tool(s) 704 to fabricate one or more features of the semiconductor device structure on the wafer 720 in a manner that is influenced by the process-enhanced feature measurements determined based on the raw measurements obtained by the secondary metrology tool(s) 712. For example, as described above, if the fabrication system 700 supports APC or another automated process management feature, the fabrication recipe executed by a subsequent processing tool(s) 704 may be adjusted by the host computing device 716 (e.g., either directly via the network 718 or indirectly via the factory control system 710) to correct any deviations between the process-enhanced feature measurement and an intended feature measurement. In other embodiments, the fabrication recipe executed by one or more preceding processing tool 702 may also be adjusted to correct any deviations between the process-enhanced feature measurement and an intended feature measurement, thereby increasing the likelihood that subsequent wafers achieve the intended feature measurements without the need for any corrective action.

As described above, the computing device 716 signals, commands, or otherwise instructs the fabrication automation system to transfer the wafer 720 to the primary metrology tool(s) 714 after the processing tool(s) 704 are done processing the wafer 720, and the computing device 716 obtains process information quantifying or otherwise describing the processing of the wafer 720 by the processing tool(s) 704 during fabrication. In accordance with one or more embodiments, the computing device 716 obtains raw measurement data from the primary metrology tool(s) 714 and determines a process-enhanced hybrid measurement for one or more physical feature(s) on the wafer 720 based on the raw measurement data for the wafer 720 from the primary metrology tool(s) 714, raw measurement data for the wafer 720 previously obtained from the secondary metrology tool(s) 712, and the process information obtained from the process control system 708 and/or the factory control system 710 that quantifies or otherwise describes the preceding processing by the processing tool(s) 702 and/or the processing tool(s) 704. In another embodiment, the computing device 716 calculates or otherwise determines a process-enhanced hybrid measurement based on the raw measurement data for the wafer 720 from the primary metrology tool(s) 714, the process information obtained from the process control system 708 and/or the factory control system 710 that quantifies or otherwise describes the preceding processing by the processing tool(s) 704, and a previously determined process-enhanced measurement. In alternative embodiments, the computing device 716 modifies the measurement recipe implemented by the primary metrology tool 714 in a manner that is influenced by the raw measurement data obtained from the secondary metrology tool(s) 712 and the process information obtained from the process control system 708 and/or the factory control system 710, such that the primary metrology tool 714 determines a process-enhanced hybrid measurement for one or more physical feature(s) on the wafer 720.

As described above in the context of FIGS. 5-6, the computing device 716 may signal, command, or otherwise instruct subsequent processing tool(s) 706 to fabricate one or more features of the semiconductor device structure on the wafer 720 in a manner that is influenced by the process-enhanced hybrid feature measurements (e.g., to correct any deviations between a process-enhanced hybrid feature measurement and an intended feature measurement). Additionally or alternatively, the computing device 716 may modify the fabrication recipe executed by one or more preceding processing tools 702, 704 to correct any deviations between a process-enhanced hybrid feature measurement and an intended feature measurement and increase the likelihood that subsequent wafers achieve the intended feature measurements without the need for any corrective action.

Figure 8:
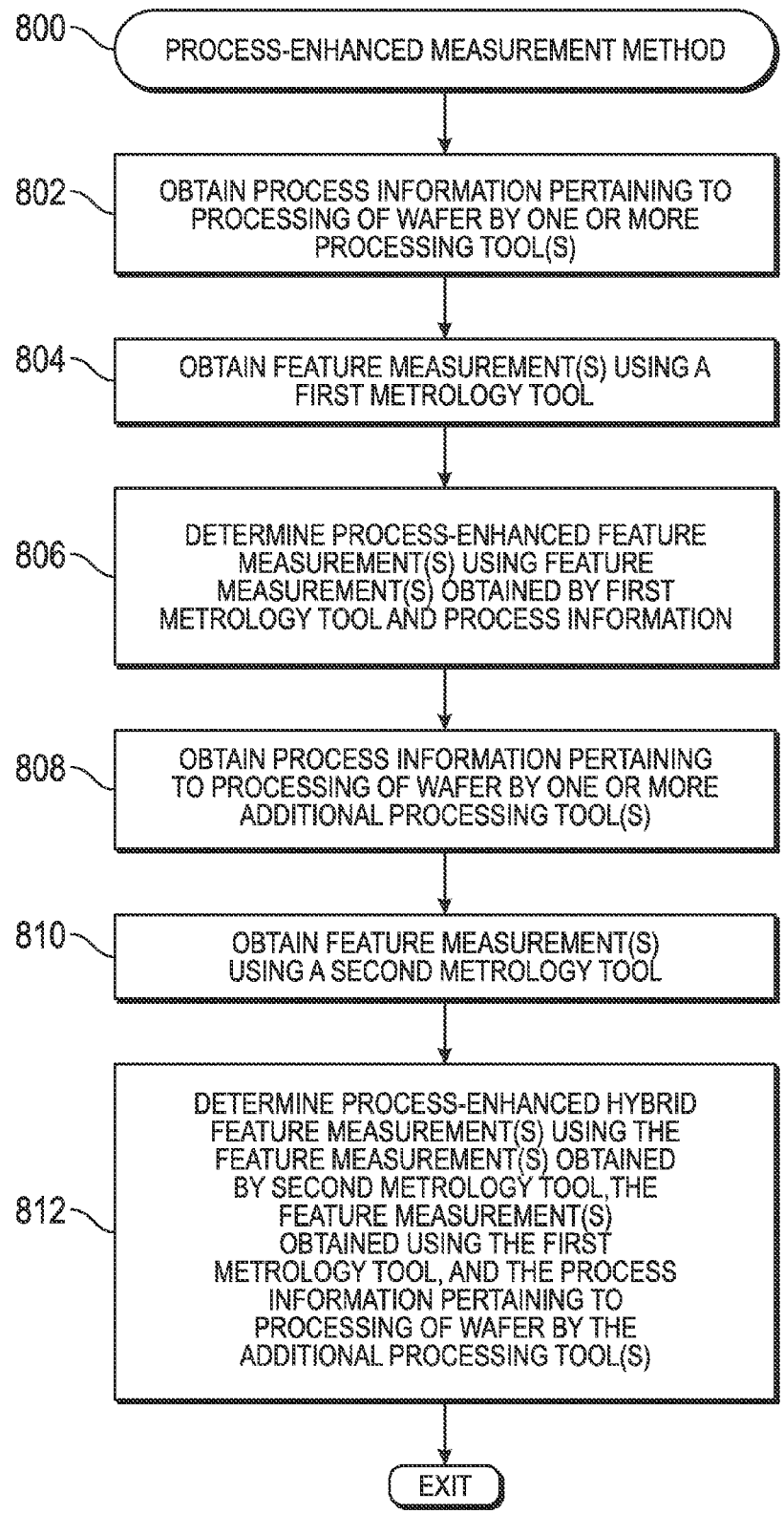
FIG. 8 is a flow diagram of an exemplary process-enhanced measurement method suitable for use with the fabrication system of FIG. 7 in an exemplary embodiment.

FIG. 8 depicts an exemplary process-enhanced measurement method 800 suitable for implementation by the fabrication system 700 to obtain process-enhanced hybrid measurements of physical features and/or dimensions of semiconductor devices. The various tasks performed in connection with the process-enhanced measurement method 800 may be performed by software, hardware, firmware, or any combination thereof. For illustrative purposes, the following description refers to elements mentioned above in connection with FIG. 7. In practice, portions of the process-enhanced measurement method 800 may be performed by different elements of the fabrication system 700, such as, for example, the process control system 708, the factory control system 710, the secondary metrology tool(s) 712, the primary metrology tool 714, and/or the host computing device 716. It should be appreciated that the process-enhanced measurement method 800 may include any number of additional or alternative tasks, the tasks need not be performed in the illustrated order and/or the tasks may be performed concurrently, and/or the process-enhanced measurement method 800 may be incorporated into a more comprehensive procedure or process having additional functionality not described in detail herein. Moreover, one or more of the tasks shown and described in the context of FIG. 8 could be omitted from a practical embodiment of the process-enhanced measurement method 800 as long as the intended overall functionality remains intact.

Referring to FIG. 8, and with continued reference to FIG. 7, in an exemplary embodiment, the process-enhanced measurement method 800 begins by obtaining process information pertaining to the fabrication of one or more features of a semiconductor device structure on a wafer by one or more processing tools that precede a metrology tool after those processing tools have processed the wafer to fabricate the one or more features thereon (task 802). As described above in the context of FIG. 7, in exemplary embodiments, after the wafer 720 is processed by one or more initial processing tools 702, the host computing device 716 obtains process information that quantifies or otherwise describes the process environment that the wafer 720 was subjected to or otherwise exposed to during processing by one or more of those processing tools 702. For example, the computing device 716 may obtain, from the processing tool 702 via the process control system 708, data, values, or other information quantifying a condition of a processing tool 702 during the fabrication of a feature on the wafer 720 by that respective processing tool 702, such as a measured temperature inside a chamber of the respective processing tool 702, a measured pressure inside a chamber of the respective processing tool 702, or the like. The computing device 716 may also obtain, from the process control system 708, the most recently obtained qualification data from the processing tool 702 that describes or otherwise indicates the relative health or condition of the processing tool 702 at or around the time at which the wafer 720 was processed by that processing tool 702. Additionally, computing device 716 may obtain, from the process control system 708, fault detection control data that describes or otherwise quantifies a predicted condition of the processing tool 702 at or around the time when the wafer 720 was processed by the processing tool 702.

In addition to the process data obtained from the process control system 708, the computing device 716 may also obtain, from the factory control system 710, context information that quantifies or otherwise describes the state of the semiconductor device structure being measured and/or the wafer 720 within the fabrication system 700 as the wafer 720 is being processed, such as, for example, the relative location of the semiconductor device structure being measured on the wafer 720, an identification of the respective processing tool 702 used to fabricate features of the semiconductor device structure on the wafer 720, a relative position of the wafer 720 and/or the semiconductor device structure being measured within the respective processing tool 702 during processing, a duration for which the wafer 720 was processed by the respective processing tool 702, and the like.

In the illustrated embodiment, the process-enhanced measurement method 800 also receives or otherwise obtains measurements for one or more physical features, dimensions and/or other attributes on the wafer from one or more metrology tools (task 804). For example, after the physical features and/or dimensions to be measured have been fabricated by the preceding processing tools 702, the wafer 720 is placed in a chamber proximate to or otherwise associated with a secondary metrology tool 712 such that the wafer 720 is aligned with the measurement arrangement 204 of the secondary metrology tool 712. As described above in the context of FIG. 3, the secondary metrology tool 712 may notify the host computing device 716 of the presence of the wafer 720, wherein the host computing device 716 provides commands and/or instructions to the secondary metrology tool 712 to initiate measurement of the physical features and/or dimensions of the semiconductor device structures on the wafer 720. The processing module 206 of the secondary metrology tool 712 signals or otherwise operates the measurement arrangement 204 to measure the physical features and/or dimensions on the wafer 720, for example, by transmitting or otherwise directing a reference signal towards the wafer 720, wherein the physical features of the wafer 720 modulate or otherwise influence the reference signal resulting in a response signal that is sensed or otherwise received by the measurement arrangement 204. The processing module 206 of the secondary metrology tool 712 receives or otherwise obtains the raw feature measurement data from the measurement arrangement 204, calculates or otherwise determines measurements for the corresponding physical features and/or critical dimensions on the wafer 720 based on characteristics of the response signal (e.g., the response signal spectra, waveforms, or the like), and stores or otherwise maintains the feature measurements in memory 208. In exemplary embodiments, the secondary metrology tool 712 communicates or otherwise provides the obtained feature measurements to the host computing device 716 and/or the primary metrology tool 714 for use in determining process-enhanced hybrid measurements for physical features and/or critical dimensions on the wafer 720, as described in greater detail below.

In exemplary embodiments, after obtaining a feature measurement from a metrology tool along with process information pertaining to the processing of the wafer that preceded the metrology tool, the process-enhanced measurement method 800 continues by determining a process-enhanced feature measurement by adjusting the feature measurement from the metrology tool in a manner that is influenced by the process information (task 806). In an exemplary embodiment, the process-enhanced feature measurements for a particular feature and/or dimension are calculated as a function of the measurement for that feature and/or dimension obtained using the metrology tool 712 and one or more different types of process information from the process control system 708 and/or the factory control system 710, for example, by weighting the feature measurement in accordance with its relative accuracy and/or reliability and weighting each different type of process information in accordance with its relative impact, correlation, or influence on the dimensions of the feature of interest. As described above in the context of FIG. 4, for a respective metrology tool 712, the host computing device 716 may determine a weighting factor representative of the relative quality of feature measurements from that secondary metrology tool 712 with respect to the relative influence of the sensor data obtained from a preceding processing tool 702 on those feature measurements. For example, for a particular critical dimension measured by the secondary metrology tool 712, the computing device 716 and/or the secondary metrology tool 712 may calculate a process-enhanced measurement of a critical dimension (CD) using the equation $CD_{PS} = \gamma_{S1} CD_S$, where $CD_{PS}$ is the process-enhanced measurement for the critical dimension, $CD_S$ is the measurement for the critical dimension that was determined or otherwise measured by the secondary metrology tool 712 and $\gamma_{S1}$ is a quality weighting factor for the feature measurement obtained by the secondary metrology tool 712 that is dependent on the values of the process information obtained for the preceding processing tool(s) 702. In other words, the quality weighting factor may be a function of the process information obtained for the preceding processing tool(s) 702. Additionally, in some embodiments, the quality weighting factor for the feature measurement obtained by the secondary metrology tool 712 may be a function of the measurement parameters or settings dictated by the measurement recipe implemented by the secondary metrology tool 712 in addition to the process information obtained for the preceding processing tool(s) 702. In this manner, the feature measurement obtained by the secondary metrology tool 712 is adjusted or otherwise influenced by the obtained process information and the obtained measurement parameters or settings for the secondary metrology tool 712.

In other embodiments, the process-enhanced measurement for a particular feature on the wafer 720 may be calculated as a weighted sum of the feature measurement from the secondary metrology tool 712, process information obtained from the process control system 708, and the process information obtained from the factory control system 710 using the quality weighting factors. For example, for a particular critical dimension measured by the secondary metrology tool 712, the computing device 716 and/or the secondary metrology tool 712 may calculate a process-enhanced measurement of a critical dimension (CD) using the equation $CD_{PS} = \gamma_{S1} CD_S + \gamma_{P1} P_1 + \gamma_{P2} P_2$, where $CD_S$ is the measurement for the critical dimension that was determined or otherwise measured by the secondary metrology tool 712, $P_1$ is a value representative of or otherwise influenced by the process information obtained from the process control system 708, $P_2$ is a value representative of or otherwise influenced by the process information obtained from the factory control system 710, $\gamma_{S1}$ is the quality weighting factor associated with the secondary metrology tool 712, $\gamma_{P1}$ is the quality weighting factor associated with the process information obtained from the process control system 708, and $\gamma_{P2}$ is the quality weighting factor associated with the process information obtained from the factory control system 710. In one embodiment, the sum of the quality weighting factors is equal to one. Again, in some embodiments, the quality weighting factor for the feature measurement obtained by the secondary metrology tool 712 may be a function of the measurement parameters or settings dictated by the measurement recipe implemented by the secondary metrology tool 712.

In a similar manner as described above in the context of FIG. 4, to determine the quality weighting factors for the feature measurement from the secondary metrology tool 712 and the different pieces of process information used to calculated the process-enhanced feature measurement, the host computing device 716 may determine or otherwise identify the number of different pieces of process information from the process control system 708 and/or the factory control system 710 to be utilized in determining the process-enhanced measurement based on a feature measurement from the secondary metrology tool 712, determine initial quality weighting factors for each respective piece of process information based on correlation metrics for the respective piece of process information with respect to the feature measurement (e.g., TMU, RMSU, $R^2$ values or other correlation coefficients, and the like) along with an initial quality weighting factor for the feature measurement from the secondary metrology tool 712. After determining initial quality weighting factors for the different pieces of process information, an initial hybrid measurement is calculated or otherwise determined as a function of the initial quality weighting factors, the feature measurement from the secondary metrology tool 712, and the pieces of process information, and the quality weighting factors may be iteratively adjusted or otherwise optimized to reduce the difference between the process-enhanced measurement and a reference measurement. The final adjusted (or optimized) weighting factors may then be stored or otherwise maintained by the computing device 716 for use in subsequently determining the process-enhanced feature measurement.

In the illustrated embodiment of FIG. 8, the process-enhanced measurement method 800 continues by obtaining process information pertaining to the fabrication of the semiconductor device structure on the wafer by one or more subsequent processing tools (task 808). In this regard, after features on the wafer 720 are measured by the secondary metrology tool(s) 712, the wafer 720 is transferred to one or more subsequent processing tools 704 for further processing. As described above, in some embodiments, the fabrication recipes used by the subsequent processing tools 704 may be influenced by the process-enhanced feature measurements that were determined based on the feature measurements from the secondary metrology tool(s) 712. After the wafer 720 is processed by a processing tool 704 to further fabricate the semiconductor device structure on the wafer 720, the host computing device 716 obtains process information that quantifies or otherwise describes the process environment that the semiconductor device structure to be measured was subjected to during fabrication of the semiconductor device structure by the processing tool 704, such as, sensor data obtained by the processing tool 704 during processing of the wafer 720, qualification data for the processing tool 704, fault detection control data for the processing tool 704, a position of the sensor device structure and/or the wafer 720 within the processing tool 704, a duration of time for which the wafer 720 was processed by the processing tool 704, and the like.

After the wafer is processed, the process-enhanced measurement method 800 continues by receiving or otherwise obtaining measurements for one or more physical features, dimensions and/or other attributes on the wafer from another metrology tool (task 810). For example, after physical features and/or dimensions to be measured have been fabricated by the processing tool(s) 704, the wafer 720 may be placed in a chamber proximate to or otherwise associated with the primary metrology tool 714 such that the wafer 720 is aligned with the measurement arrangement 204 of the primary metrology tool 714. As described above, to measure the physical features and/or dimensions on the wafer 720, a reference signal may be transmitted or otherwise directed towards the wafer 720, wherein the physical features of the wafer 720 modulate or otherwise influence the reference signal resulting in a response signal that is sensed or otherwise received by the measurement arrangement 204. In accordance with one or more embodiments, the processing module 206 of the primary metrology tool 714 receives or otherwise obtains the raw feature measurement data, calculates or otherwise determines measurements for the corresponding physical features and/or critical dimensions on the wafer 720 based on characteristics of the response signal, and stores or otherwise maintains the feature measurements in memory 208.

In exemplary embodiments, after obtaining a feature measurement from the metrology tool along with process information pertaining to the processing of the wafer that preceded the metrology tool, the process-enhanced measurement method 800 continues by determining a process-enhanced hybrid feature measurement by adjusting the feature measurement in a manner that is influenced by the process information pertaining to the processing by preceding processing tool(s) and feature measurements obtained by preceding metrology tool(s) (task 812). In this regard, the process-enhanced hybrid feature measurement for a particular feature and/or dimension are calculated as a function of the measurement for that feature and/or dimension obtained using the metrology tool 714, a feature measurement (for either the same or a different feature and/or dimension) obtained using a secondary metrology tool 712, and one or more different types of process information from the process control system 708 and/or the factory control system 710 pertaining to the processing of the wafer 720 by the processing tool(s) 704. As described above, the process-enhanced hybrid feature measurement is determined by weighting the feature measurements in accordance with their relative accuracy and/or reliability and weighting each different type of process information in accordance with its relative impact, correlation, or influence on the dimensions of the feature of interest. For example, for a particular critical dimension measured by the primary metrology tool 714, the computing device 716 and/or the secondary metrology tool 712 may calculate a process-enhanced hybrid measurement of a critical dimension (CD) using the equation $CD_{PH} = \gamma_P CD_P$, where $CD_{PH}$ is the process-enhanced measurement for the critical dimension, $CD_P$ is the measurement for the critical dimension that was determined or otherwise measured by the primary metrology tool 714 and $\gamma_{S1}$ is a quality weighting factor for the feature measurement obtained by the primary metrology tool 714 that is dependent on the values of the process information obtained for the processing tool(s) 704 and/or the processing tool(s) 702 and a feature measurement obtained by a secondary metrology tool 712 (or a process-enhanced feature measurement determined based on a feature measurement obtained by a secondary metrology tool 712). In other words, the quality weighting factor for the feature measurement obtained by the primary metrology tool 714 may be a function of the process information obtained for the processing tool(s) 704, the process information obtained for the processing tool(s) 702, a feature measurement obtained by a secondary metrology tool 712 (e.g., $CD_S$) and/or a process-enhanced feature measurement determined based on a feature measurement obtained by a secondary metrology tool 712 (e.g., $CD_{PS}$). Additionally, in some embodiments, the quality weighting factor for the feature measurement obtained by the primary metrology tool 714 may be a function of the measurement parameters or settings dictated by the measurement recipe implemented by the primary metrology tool 714. In this manner, the feature measurement obtained by the primary metrology tool 714 is adjusted or otherwise influenced by the obtained process information, the obtained measurement parameters or settings for the primary metrology tool 714, and a feature measurement obtained by a secondary metrology tool 712 (e.g., $CD_S$) and/or a process-enhanced feature measurement determined based on a feature measurement obtained by a secondary metrology tool 712 (e.g., $CD_{PS}$).

In other embodiments, the process-enhanced hybrid measurement for a particular feature on the wafer 720 may be calculated as a weighted sum of the measurement of that feature obtained from the primary metrology tool 714, a feature measurement obtained from the secondary metrology tool 712 (or a process-enhanced feature measurement determined based on a feature measurement obtained by a secondary metrology tool 712), process information obtained from the process control system 708 pertaining to processing by one or more preceding processing tools 702, 704, and the process information obtained from the factory control system 710 pertaining to processing by one or more preceding processing tools 702, 704. For example, for a particular critical dimension measured by the primary metrology tool 714, the computing device 716 and/or the primary metrology tool 714 may calculate a process-enhanced hybrid measurement of a critical dimension (CD) using the equation $CD_{PH} = \gamma_1 CD_P + \gamma_2 CD_S + \gamma_3 P_1 + \gamma_4 P_2$, where $CD_P$ is the measurement for the critical dimension that was determined or otherwise measured by the primary metrology tool 714, $CD_S$ is a measurement for a critical dimension or feature that was determined or otherwise measured by a secondary metrology tool 712 (or alternatively, a process-enhanced feature measurement determined based on a feature measurement obtained by a secondary metrology tool 712), $P_1$ is a value representative of or otherwise influenced by the process information pertaining to the processing by a preceding processing tool 702, 704 that was obtained from the process control system 708, $P_2$ is a value representative of or otherwise influenced by the process information pertaining to the processing by a preceding processing tool 702, 704 that was obtained from the factory control system 710, $\gamma_1$ is a quality weighting factor associated with the primary metrology tool 714, $\gamma_2$ is a quality weighting factor associated with the secondary metrology tool 712, $\gamma_3$ is the quality weighting factor associated with the process information obtained from the process control system 708, and $\gamma_4$ is the quality weighting factor associated with the process information obtained from the factory control system 710. In other embodiments, the process-enhanced hybrid measurement of a critical dimension (CD) may be calculated using the equation $CD_{PH} = \gamma_1 CD_P + \gamma_2 CD_S$, where $\gamma_1$ is a quality weighting factor associated with the primary metrology tool 714 that is determined as a function of the processing information for the preceding processing tool(s) 704 and/or the measurement parameters and/or settings of the primary metrology tool 714, and $\gamma_2$ is a quality weighting factor associated with the secondary metrology tool 712 that is determined as a function of the processing information for its preceding processing tool(s) 702 and/or the measurement parameters and/or settings of the secondary metrology tool 712. In a similar manner as described above, the quality weighting factors may be iteratively adjusted or otherwise optimized to reduce the difference between the process-enhanced hybrid measurement of a feature of interest and a reference measurement for the feature and stored or otherwise maintained by the computing device 716 and/or the primary metrology tool 714 for use in subsequently determining the process-enhanced hybrid feature measurement. It should be noted there are numerous ways to utilize the process information to augment or otherwise adjust feature measurements obtained by the metrology tools 712, 714 to achieve accurate process-enhanced feature measurements, and the above equations are mere examples provided to aid in understanding of the subject matter.

In accordance with one or more embodiments, the primary metrology tool 714 communicates or otherwise provides its obtained feature measurements (or alternatively, its raw measurement data) to the host computing device 716, wherein the host computing device 716 determines the process-enhanced hybrid feature measurements based on the feature measurements from the primary metrology tool 714 in a manner that is influenced by process information pertaining to processing of the wafer 720 by the processing tool 704, feature measurements obtained from the secondary metrology tool 712, and/or process information pertaining to processing of the wafer 720 by the processing tool 702. In some embodiments, the host computing device 716 determines the process-enhanced hybrid feature measurements based on the feature measurements from the primary metrology tool 714 in a manner that is influenced by process information pertaining to processing of the wafer 720 by the processing tool 704 and the process-enhanced feature measurements determined based on the feature measurements obtained from the secondary metrology tool 712 and process information pertaining to processing of the wafer 720 by the processing tool 702. In another embodiment, the host computing device 716 may modify the measurement recipe for the primary metrology tool 714 and provide the primary metrology tool 714 with process information obtained from the process control system 708 and/or the factory control system 710 and feature measurements obtained by the secondary metrology tool 712, so that the primary metrology tool 714 calculates or otherwise determines the process-enhanced hybrid feature measurements based on the raw measurement data obtained by the primary metrology tool 714, the process information pertaining to processing of the wafer 720 by the processing tool 704, the feature measurements obtained from the secondary metrology tool 712.

As described above in the context of FIG. 3, in some embodiments, process-enhanced hybrid measurements may be calculated or otherwise determine in an iterative manner. For example, in accordance with one or more embodiments, after a process-enhanced hybrid feature measurement has been determined based on a feature measurement obtained by the primary metrology tool 714 and the process information pertaining to processing of the wafer 720 by the processing tool(s) 704, the process-enhanced hybrid feature measurement may be utilized by the computing device 716 and/or the secondary metrology tool 712 to calculate or otherwise determine an adjusted measurement for a particular physical feature and/or dimension using the process-enhanced hybrid measurement determined based on the feature measurement obtained from the primary metrology tool 714 and the previous feature measurement measured by the secondary metrology tool 712 (e.g., the feature measurement previously calculated using the raw feature measurement data obtained by the secondary metrology tool 712). In this regard, another process-enhanced hybrid feature measurement may be calculated as a weighted sum of the process-enhanced hybrid measurement determined based on the feature measurement obtained from the primary metrology tool 714, the process information pertaining to processing of the wafer 720 by a preceding processing tool 702 and/or a subsequent processing tool 704, and the feature measurement obtained using the measurement hardware of the secondary metrology tool 712. Thus, a process-enhanced hybrid measurement determined based on a feature measurement obtained by a primary metrology tool 714 may be utilized to augment or otherwise modify the process-enhanced feature measurements determined based on a feature measurement obtained by a secondary metrology tool 712, and vice versa. In this regard, the adjusted process-enhanced feature measurement is also a hybrid feature measurement.

In a similar manner as described above in the context of FIGS. 1-6, in some embodiments, the process-enhanced hybrid feature measurements may be utilized by the host computing device 716 to modify the fabrication recipe implemented by one or more subsequent processing tool(s) 706 to further process the wafer 720. Additionally, in some embodiments, the process-enhanced hybrid feature measurements may be stored by the host computing device 716 in memory 726, so that a user may subsequently access the host computing device 716 to view measurements for the physical features and/or dimensions on the wafer 720, wherein the processing module 724 presents or otherwise displays the process-enhanced hybrid feature measurements (or a graphical representation thereof) to the user.

Still referring to FIGS. 7-8, the process-enhanced measurement method 800 determines accurate and reliable feature measurements by utilizing feature measurements obtained by different metrology tools and accounting for the processing environment a wafer was subjected to during processing. In this regard, by appropriately weighting the process information that quantifies or otherwise describes the actual fabrication of the semiconductor device structure on wafer relative to feature measurements obtained by metrology tools, more accurate feature measurements may be determined. At the same time, by virtue of the improved accuracy, the metrology costs may be reduced, for example, by reducing the number of metrology tools required, reducing the number of times a wafer and/or semiconductor device structure needs to be measured, and/or reducing the number of iterations required to achieve a particular level of accuracy.

For the sake of brevity, conventional techniques related to correlation and/or uncertainty analysis, semiconductor metrology tools and/or methods, semiconductor fabrication, and other functional aspects of the systems (and the individual operating components of the systems) are not described in detail herein. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A system for fabricating a semiconductor device structure, the system comprising:
    a first processing tool configured to fabricate a feature of the semiconductor device structure;
    a first metrology tool configured to obtain a first measurement of an attribute of the semiconductor device structure; and
    a computing device coupled to the first metrology tool and configured to obtain process information pertaining to the fabrication of the feature of the semiconductor device structure by the first processing tool and determine a second measurement of the attribute based at least in part on the first measurement in a manner that is influenced by the process information such that the second measurement has improved accuracy over the first measurement of the attribute of the semiconductor device structure.

2. The system of claim 1, wherein the process information comprises data quantifying a condition of the first processing tool during the fabrication of the feature.

3. The system of claim 2, wherein the condition of the first processing tool comprises a measured value for an environmental condition inside a chamber of the first processing tool while a wafer having the semiconductor device structure fabricated thereon is disposed therein.

4. The system of claim 3, wherein the environmental condition comprises a temperature, a pressure, a flow rate, or an electrical potential.

5. The system of claim 1, wherein the process information comprises qualification data indicating a condition of the first processing tool.

6. The system of claim 1, wherein the process information comprises data quantifying a predicted condition of the first processing tool during the fabrication of the feature.

7. The system of claim 1, wherein the process information comprises context information quantifying a state of the semiconductor device structure during the fabrication of the feature.

8. The system of claim 7, wherein the context information comprises a location of the semiconductor device structure on a wafer, a chamber of the first processing tool where the wafer was processed, or a duration the wafer was processed by the first processing tool.

9. The system of claim 1, wherein the computing device determines the second measurement by weighting the first measurement by a first factor and weighting the process information by a second factor.

10. The system of claim 9, the attribute comprising a dimension of the feature, wherein the computing device determines a model for the dimension of the feature as a function of the process information and identifies the second factor based on a correlation metric for the model.

11. The system of claim 1, wherein:
    the first metrology tool measures the feature to obtain the first measurement of the feature; and
    the computing device determines the second measurement of the feature by adjusting the first measurement of the feature in a manner that is influenced by the process information.

12. The system of claim 1, further comprising a second metrology tool to provide a third measurement of the semiconductor device structure, wherein the computing device determines the second measurement based at least in part on the first measurement, the third measurement, and the process information.

13. A method of fabricating a semiconductor device structure, the method comprising:
- obtaining a first measurement of a first attribute of the semiconductor device structure from a first metrology tool;
- obtaining process information pertaining to fabrication of a feature of the semiconductor device structure by a first processing tool; and
- determining a second measurement for the first attribute based at least in part on the first measurement in a manner that is influenced by the process information such that the second measurement has improved accuracy over the first measurement of the first attribute of the semiconductor device structure.

14. The method of claim 13, further comprising obtaining a third measurement of the semiconductor device structure from a second metrology tool, wherein determining the second measurement comprises determining the second measurement for the first attribute based at least in part on the first measurement and the third measurement in a manner that is influenced by the process information.

15. The method of claim 14, wherein determining the second measurement comprises determining a weighted sum of the first measurement and the third measurement, wherein a first weighting factor associated with the first metrology tool or a second weighting factor associated with the second metrology tool is influenced by the process information.

16. The method of claim 13, further comprising:
- obtaining a third measurement of a second attribute of the semiconductor device structure from a second metrology tool;
- obtaining second process information pertaining to fabrication of the feature of the semiconductor device structure by a second processing tool; and
- determining a fourth measurement for the second attribute based at least in part on the third measurement and the second measurement for the first attribute in a manner that is influenced by the second process information.

17. The method of claim 13, further comprising modifying a fabrication recipe of a second processing tool based at least in part on the second measurement.

18. The method of claim 13, further comprising obtaining measurement settings for the first metrology tool, wherein determining the second measurement for the first attribute comprises determining the second measurement based at least in part on the first measurement, the measurement settings, and the process information.

19. The method of claim 13, further comprising:
- determining a model for a dimension of the feature as a function of the process information, the first attribute comprising the feature; and
- determining a first weighting factor for the process information based on a correlation metric for the model, wherein determining the second measurement comprises weighting the process information by the first weighting factor and weighting the first measurement by a second weighting factor.

20. A method of fabricating a semiconductor device structure, the method comprising:
- obtaining a first measurement of a feature of the semiconductor device structure from a first metrology tool;
- obtaining a second measurement of an attribute of the semiconductor device structure from a second metrology tool;
- obtaining process information pertaining to fabrication of the feature by a first processing tool; and
- determining a process-enhanced hybrid measurement for the feature based at least in part on the first measurement in a manner that is influenced by the process information and the second measurement such that the process-enhanced hybrid measurement has improved accuracy over the first measurement of the feature of the semiconductor device structure.

* * * * *